United States Patent [19]
Kondo et al.

[11] Patent Number: 5,793,209
[45] Date of Patent: Aug. 11, 1998

[54] NUCLEAR MAGNETIC RESONANCE IMAGING APPARATUS USING ASYMMETRIC TORQUE-FREE ACTIVE SHIELD GRADIENT COILS

[75] Inventors: Masafumi Kondo; Masao Yui, both of Kanagawa-ken, Japan

[73] Assignee: Kabushiki Kaisha Toshiba, Kawasaki, Japan

[21] Appl. No.: 616,805

[22] Filed: Mar. 15, 1996

[30] Foreign Application Priority Data

Mar. 16, 1995 [JP] Japan .................. 7-057630

[51] Int. Cl.$^6$ .................................. G01V 3/00
[52] U.S. Cl. ........................ 324/318; 128/653.5
[58] Field of Search ........................ 324/318, 322, 324/314, 300, 306, 307, 309; 128/653.5

[56] References Cited

U.S. PATENT DOCUMENTS

| | | | |
|---|---|---|---|
| 5,343,148 | 8/1994 | Westphal et al. | 324/318 |
| 5,545,996 | 8/1996 | Morich et al. | 324/318 |
| 5,561,371 | 10/1996 | Schenck | 324/318 |
| 5,581,185 | 12/1996 | Petropoulos et al. | 324/318 |

OTHER PUBLICATIONS

Petropoulos et al., "Torque-Free Asymmetric Transverse Gradient Coil", 12th Annual Meetings of Society of Magnetic Resonance in Medicine, p. 1035 (1993).

Abduljalil et al., "Torque Compensated Asymmetric Gradient Coils for EPI", 12th Annual Meetings of Society of Magnetic Resonance in Medicine, p. 1036 (1993).

*Primary Examiner*—Louis M. Arana
*Attorney, Agent, or Firm*—Foley & Lardner

[57] ABSTRACT

A nuclear magnetic resonance imaging apparatus using asymmetric torque-free active shield gradient coils for realizing a sufficient imaging field of view, a sufficient eddy current magnetic field suppression effect, and a substantially complete torque cancellation. The gradient coil is formed by: a primary coil having an asymmetric current distribution in which all current returns are asymmetrically arranged toward one side of the primary coil, a shield coil having a current distribution for cancelling out a leakage magnetic field generated by the asymmetric current distribution of the primary coil, and a torque cancellation coil, provided adjacent to the primary coil and the shield coil, having a current distribution for cancelling out a torque acting on the primary coil and the shield coil in a static magnetic field. The primary coil generates the gradient magnetic field which cancels out a gradient field contribution from the torque cancellation coil to produce a desired gradient magnetic field.

36 Claims, 25 Drawing Sheets

FIG.1 PRIOR ART

| G COIL TYPE | IDEAL CONDITION | SHORT AXIS ASGC | ASYMMETRIC G COIL | TORQUE-FREE ASYMMETRIC G COIL | ASGC FOR WHOLE BODY DRIVEN BY ACCLERATOR (OVER 20mT/m & BELOW 0.2ms) |
|---|---|---|---|---|---|
| IMAGING FIELD OF VIEW | O (ENTIRE HEAD) | X (DIFFICULT FOR CEREBELLUM & BRAIN STEM) | O | O | ⊚ (FOR WHOLE BODY) |
| LEAKAGE MAGNETIC FIELD SHIELDING | O (AS GOOD AS ASGC FOR WHOLE BODY) | O | X (NON-SHIELDING) | X (NON-SHIELDING) | O |
| TORQUE CANCELLATION | O (TORQUE-FREE) | O | X (NO TORQUE CANCELLATION) | O | O |
| NOISE (VIBRATION) | O (AS GOOD AS USUAL MRI) | O | O | O | △ (10 TIMES OR MORE OF NOISE) |
| dB/dt | O (BELOW 20 T/s) | O | O | O | △ (OVER ALLOWABLE LEVEL) |
| REAL TIME PERFORMANCE (HEAT GENERATION) | O (10 IMAGES/s CONTINUOUS) | O | O | O | △ (10 TIMES OR MORE OF HEAT GENERATION) |
| TOTAL EVALUATION | O | X | X | △ | △ |

▭ CURRENTS FLOWING IN
▨ CURRENTS FLOWING OUT

▭ CURRENTS FLOWING IN
▬ CURRENTS FLOWING OUT

☐ CURRENTS FLOWING IN
▨ CURRENTS FLOWING OUT

▭ CURRENTS FLOWING IN
▨ CURRENTS FLOWING OUT

☐ CURRENTS FLOWING IN
▨ CURRENTS FLOWING OUT

☐ CURRENTS FLOWING IN
▨ CURRENTS FLOWING OUT

☐ CURRENTS FLOWING IN
▦ CURRENTS FLOWING OUT

☐ CURRENTS FLOWING IN
▦ CURRENTS FLOWING OUT

▭ CURRENTS FLOWING IN
▭ CURRENTS FLOWING OUT

ZX SHIM $Z^2-X^2$ SHIM ($\theta = 144.7°$)

$Z^2X$ SHIM $Z^2X$ SHIM ($\theta = 108.66°$)

XY SHIM

XY SHIM

ZX SHIM $Z^2-X^2$ SHIM ($\theta = 144.7°$)

$Z^2X$ SHIM $Z^2X$ SHIM ($\theta = 108.66°$)

XY SHIM

XY SHIM

NUCLEAR MAGNETIC RESONANCE IMAGING APPARATUS USING ASYMMETRIC TORQUE-FREE ACTIVE SHIELD GRADIENT COILS

BACKGROUND OF THE INVENTION

1. Field of the Invention

The present invention relates to a nuclear magnetic resonance imaging apparatus, and more particularly, to gradient coils for generating gradient magnetic fields in a nuclear magnetic resonance imaging apparatus.

2. Description of the Background Art

As is well known, nuclear magnetic resonance imaging is a method for imaging microscopic chemical and physical information of matters by utilizing the nuclear magnetic resonance phenomenon in which the energy of a radio frequency magnetic field rotating at a specific frequency can be resonantly absorbed by a group of nuclear spins having unique magnetic moments which are placed in a homogeneous static magnetic field.

This nuclear magnetic resonance imaging has been attracting much attention because of its capability for an imaging of a physical shape information on a living body at high contrast, as well as an imaging of various other types of functional information such as a magnetic resonance angiography (MRA), a brain function imaging, a blood flow imaging, a diffusion imaging, a chemical shift imaging, a temperature measurement, etc.

In particular, there has been a significant advance in the imaging scheme such an ultra high speed MRI scheme including EPI scheme, a high speed scanning scheme including Fast SE and GRASE, etc. These imaging schemes require a considerably improved gradient field property (i.e., a considerable increase in a gradient field strength and a considerable shortening of a switching time) in order to improve the image quality and shorten the imaging time. Recently, a realization of such a considerably improved gradient field property becomes feasible due to the advance in the gradient field power source technique relating to an accelerator, etc.

However, in practice, the ultra high speed scanning scheme gives rise to some serious and difficult problems concerning: (1) an increase of psychological and physical burdens on a patient due to a considerable increase (more than ten times of a usual MRI) of a noise level (a vibration level); a generation of a magnetic stimulation due to a considerable increase (as much as several times of a usual MRI) of a time change rate a gradient field (dB/dt); and (3) a restriction on a real time performance due to a considerable increase (as much as several times of a usual MRI) of a resistive heat generation. Without resolving these problems, there is little hope for the ultra high speed scanning scheme to be established as a routine diagnostic method in clinical practices.

In recent years, as a proposition to resolve the above problems for a limited case of a head portion imaging, there are propositions for various types of compact gradient coil (compact G coil) for head portion imaging, which can be installed as an option in an MRI system for whole body imaging. In comparison with a usual G coil for whole body imaging of the same gradient field property, this compact G coil is expected to be capable of realizing more than ten times smaller noise (due to differences in a number of current turns and a length of conductor), more than several times smaller dB/dt (due to a different in gradient field region size), and more than ten times smaller heat generation (due to a difference in resistance) for enabling a realization of a considerably improved real time performance.

On a basis of this considerably improved gradient coil property, there will a great potential for a wide use of various next generation imaging schemes such as high precision MRA, brain function imaging, Diffusion & Perfusion imaging, etc. in a routine clinical diagnosis for the head portion. In addition, it may also be possible to develop some totally new pulse sequences for head portion imaging which are not realizable even by means of a G coil system using accelerators for whole body imaging.

However, the conventionally known compact G coils have been associated with the following problems, as summarized in a table of FIG. 1.

First, there is a short axis ASGC (Active Shield Gradient Coil) which is formed by a primary coil and a shield coil to suppress the conventionally problematic eddy current magnetic field considerably.

This short axis ASGC has a field formation current section for forming a desired gradient magnetic field and a return current section for simply returning currents from the field formation current section, so that there has been a problem that, when an axial length is limited as in a case of a head portion imaging where it is limited to a length up to the shoulders (up to about 20 cm), the influence of the return current section can be so significant as to limit a head portion imaging region considerably (to that which barely covers the cerebrum portion but not covering the cerebellum and brain stem portions).

Secondly, there is a proposition of an asymmetric G coil in which the current return section of one side (shoulder side=head insertion side) on an axial direction of a G coil is arranged densely near the current return section of another side. FIG. 2 shows an asymmetric transverse G coil proposed by Roemer, as disclosed in Japanese Patent Application Laid Open No. 5-269099 (1993). By means of this asymmetric G coil, it becomes possible to obtain a necessary imaging field of view for a head portion even when the axial length is limited to a length up to the shoulders, as a ratio of the imaging field of view with respect to the axial length becomes sufficiently large.

However, this asymmetric G coil is associated with a serious problem concerning a generation of a torque due to the Lorentz force exerted on an asymmetric current path. Moreover, this asymmetric G coil is not an active shield type, so that the leakage magnetic field is not at all suppressed and the problem of residual eddy current magnetic field also remains.

Thirdly, there is a proposition of a torque-free G coil, as proposed by Abduljalil et al. and also by Petropouulost et al., both in the 12th Annual Meetings of Society of Magnetic Resonance in Medicine, 1993. As an example, FIG. 3 shows a torque-free G coil proposed by Abduljalil et al.

However, this torque-free G coil is also not an active shield type, so that the leakage magnetic field is not at all suppressed, and the problem of residual eddy current magnetic field remains.

As such, up to now, there has been no proposition for a compact G coil for head portion imaging which can satisfy all of the conditions regarding the imaging region, the leakage magnetic field shielding property, and the torque cancellation.

SUMMARY OF THE INVENTION

It is therefore an object of the present invention to provide a nuclear magnetic resonance imaging apparatus using gradient coils capable of realizing a sufficient imaging field of view for a head portion imaging comparable to the conventional asymmetric G coil, a sufficient eddy current magnetic field suppression effect comparable to the conventional ASGC, and a substantially complete torque cancellation.

According to one aspect of the present invention there is provided a gradient coil for a nuclear magnetic resonance imaging, comprising: an asymmetric active shield gradient coil formed by: a primary coil having an asymmetric current distribution in which all current returns are asymmetrically arranged toward one side of the primary coil, for generating a gradient magnetic field; and a shield coil having a current distribution for cancelling out a leakage magnetic field generated by the asymmetric current distribution of the primary coil; and a torque cancellation coil, provided adjacent to the primary coil and the shield coil, having a current distribution for cancelling out a torque acting on the primary coil and the shield coil in a static magnetic field; wherein the primary coil generates the gradient magnetic field which cancels out a gradient field contribution from the torque cancellation coil to produce a desired gradient magnetic field.

According to another aspect of the present invention there is provided a nuclear magnetic resonance imaging apparatus, comprising: gradient coil means including: an asymmetric active shield gradient coil formed by: a primary coil having an asymmetric current distribution in which all current returns are asymmetrically arranged toward one side of the primary coil, for generating a gradient magnetic field; and a shield coil having a current distribution for cancelling out a leakage magnetic field generated by the asymmetric current distribution of the primary coil; and a torque cancellation coil, provided adjacent to the primary coil and the shield coil, having a current distribution for cancelling out a torque acting on the primary coil and the shield coil in a static magnetic field; wherein the primary coil generates the gradient magnetic field which cancels out a gradient field contribution from the torque cancellation coil to produce a desired gradient magnetic field; and imaging means for imaging a body to be examined placed in a static magnetic field by applying radio frequency magnetic field onto the body to be examined and operating the gradient coil means to apply the desired gradient magnetic field onto the body to be examined according to a pulse sequence, detecting nuclear magnetic resonance signals emitted from the body to be examined in response to the radio frequency magnetic field and the gradient magnetic field, and processing the nuclear magnetic resonance signals to construct nuclear magnetic resonance images.

According to another aspect of the present invention there is provided a gradient coil for a nuclear magnetic resonance imaging apparatus, comprising: first gradient coil means including: a first primary coil having an asymmetric current distribution in which all current returns are asymmetrically arranged toward one side of the first primary coil, for generating a first gradient magnetic field; and a first shield coil having a current distribution for cancelling out a leakage magnetic field generated by the asymmetric current distribution of the first primary coil; and second gradient coil means including: a second primary coil having an asymmetric current distribution in which all current returns are asymmetrically arranged toward one side of the second primary coil, for generating a second gradient magnetic field; and a second shield coil having a current distribution for cancelling out a leakage magnetic field generated by the asymmetric current distribution of the second primary coil; wherein the first and second gradient coil means are arranged adjacent to each other symmetrically with respect to a border between the first and second gradient coil means, each one of the first and second gradient coil means functions as a torque cancellation coil for cancelling out a torque acting on another one of the first and second gradient coil means in a static magnetic field.

According to another aspect of the present invention there is provided a nuclear magnetic resonance imaging apparatus, comprising: first gradient coil means including: a first primary coil having an asymmetric current distribution in which all current returns are asymmetrically arranged toward one side of the first primary coil, for generating a first gradient magnetic field; and a first shield coil having a current distribution for cancelling out a leakage magnetic field generated by the asymmetric current distribution of the first primary coil; second gradient coil means including: a second primary coil having an asymmetric current distribution in which all current returns are asymmetrically arranged toward one side of the second primary coil, for generating a second gradient magnetic field; and a second shield coil having a current distribution for cancelling out a leakage magnetic field generated by the asymmetric current distribution of the second primary coil; wherein the first and second gradient coil means are arranged adjacent to each other symmetrically with respect to a border between the first and second gradient coil means, each one of the first and second gradient coil means functions as a torque cancellation coil for cancelling out a torque acting on another one of the first and second gradient coil means in a static magnetic field; and imaging means for imaging two bodies to be examined placed in a static magnetic field by applying radio frequency magnetic fields onto said two bodies to be examined and operating the first and second gradient coil means to apply the first and second gradient magnetic fields onto said two bodies to be examined, respectively, according to pulse sequences, detecting nuclear magnetic resonance signals emitted from said two bodies to be examined in response to the radio frequency magnetic fields and the first and second gradient magnetic fields, and processing the nuclear magnetic resonance signals to construct nuclear magnetic resonance images.

According to another aspect of the present invention there is provided a nuclear magnetic resonance imaging apparatus, comprising: imaging means for imaging a body to be examined placed in a static magnetic field by applying radio frequency magnetic field and gradient magnetic field onto the body to be examined according to a pulse sequence, detecting nuclear magnetic resonance signals emitted from the body to be examined in response to the radio frequency magnetic field and the gradient magnetic field, and processing the nuclear magnetic resonance signals to construct nuclear magnetic resonance images; and a shim coil having an asymmetric current distribution in which at least one current return is arranged asymmetrically along an axial direction of the shim coil, for adjusting a homogeneity of the static magnetic field.

Other features and advantages of the present invention will become apparent from the following description taken in conjunction with the accompanying drawings.

BRIEF DESCRIPTION OF THE DRAWINGS

FIG. 1 is a table summarizing features of various conventional gradient coils.

DETAILED DESCRIPTION OF THE PREFERRED EMBODIMENTS

Now, with references to the drawings, various embodiments of a nuclear magnetic resonance imaging apparatus using asymmetric torque-free active shield gradient coils according to the present invention will be described in detail.

Figure 4:
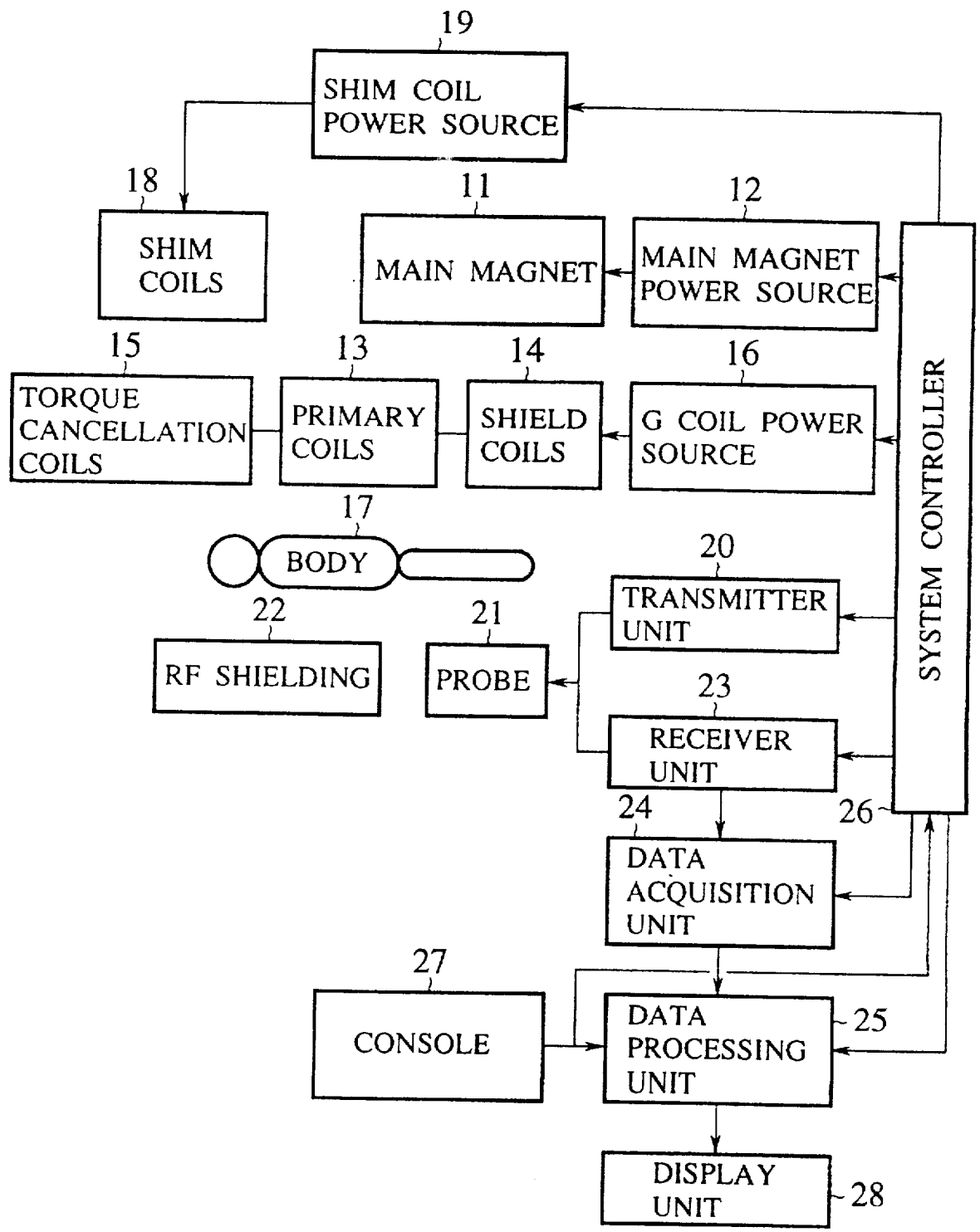
FIG. 4 is a schematic block diagram of a nuclear magnetic resonance imaging apparatus for first to eighth embodiments of the present invention.

First, a nuclear magnetic resonance imaging apparatus suitable for the following first to eighth embodiments of the present invention has an overall configuration as shown in FIG. 4.

This nuclear magnetic resonance imaging apparatus of FIG. 4 comprises: a main magnet 11 for generating a static magnetic field; a main magnet power source 12 for driving the main magnet 11; primary coils 13 for generating gradient magnetic fields to be applied to a body to be examined 17; shield coils 14 provided around the primary gradient coils 13; a torque cancellation coils 15 provided in conjunction with the primary coils 13 and the shield coils 14; a gradient coil power source 16 for driving the primary gradient coils 13 the shield coils 14, and the torque cancellation coils 15; shim coils 18 for adjusting the homogeneity of the static magnetic field; a shim coil power source 19 for driving the shim coils 18; a probe 21 for applying radio frequency (RF) pulses to a body to be examined 17 and receiving nuclear magnetic resonance (NMR) signals from the body to be examined 17; an RF shielding 22 provided between the primary gradient coils 13 and the probe 21; a transmitter unit 20 for driving the probe 21 to transmit the desired RF pulses; an RF shielding 22 provided between the primary coils 13 and the probe 21; and a receiver unit 23 for detecting the NMR signals received by the probe 21.

In addition, this apparatus of FIG. 4 further comprises: a data acquisition unit 24 for acquiring and A/D converting the NMR signals detected by the receiver unit 23; a data processing unit 25 for data processing the A/D converted NMR signals to reconstruct the desired NMR image; a display unit 28 for displaying the NMR image reconstructed by the data processing unit 25; a system controller 26 for controlling the operations of the main magnet power source 12, the gradient coil power source 15, the shim coil power source 19, the transmitter unit 20, the receiver unit 23, the data acquisition unit 24, and the data processing unit 25, so as to realize the desired imaging pulse sequence; and a console 27 from which an operator enters various control commands to the system controller 26 and the data processing unit 25.

Here, the main magnet 11 is driven by the main magnet power source 12 while the primary gradient coils 13, the shield coils 14, and the torque cancellation coils 15 are connected in series and commonly driven by the gradient coil power source 16, while the shim coils 18 are driven by the shim coil power source 19, such that a uniform static magnetic field and the gradient magnetic fields having linear gradients in three mutually orthogonal directions are applied onto the body to be examined 17.

In this apparatus of FIG. 4, the body to be examined 17 is placed inside the static magnetic field generated by the main magnet 11, and three orthogonal gradient magnetic fields generated by the primary gradient coils 13 are superposed onto the static magnetic field while the RF pulses are applied by the probe 21, according to the desired imaging pulse sequence.

Then, the NMR signals emitted from the patient 17 in response to the application of the RF pulses are received by the probe 21. Here, the common probe 21 may be used for the transmission of the RF pulses and the reception of the NMR signals, or separate probes 21 may be provided for the transmission of the RF pulses and the reception of the NMR signals.

The NMR signals received by the probe 21 are detected at the receiver unit 23, A/D converted at the data acquisition unit 24, and sent to the data processing unit 25 which reconstructs the desired NMR images by using appropriate data processing operations such as the Fourier transformation to calculate the density distribution of the desired nuclei within the body to be examined 17, etc.

The reconstructed NMR images are then displayed at the display unit 28.

Now, the first embodiment of the asymmetric torque-free active shield gradient coil according to the present invention will be described in detail.

Figure 5:
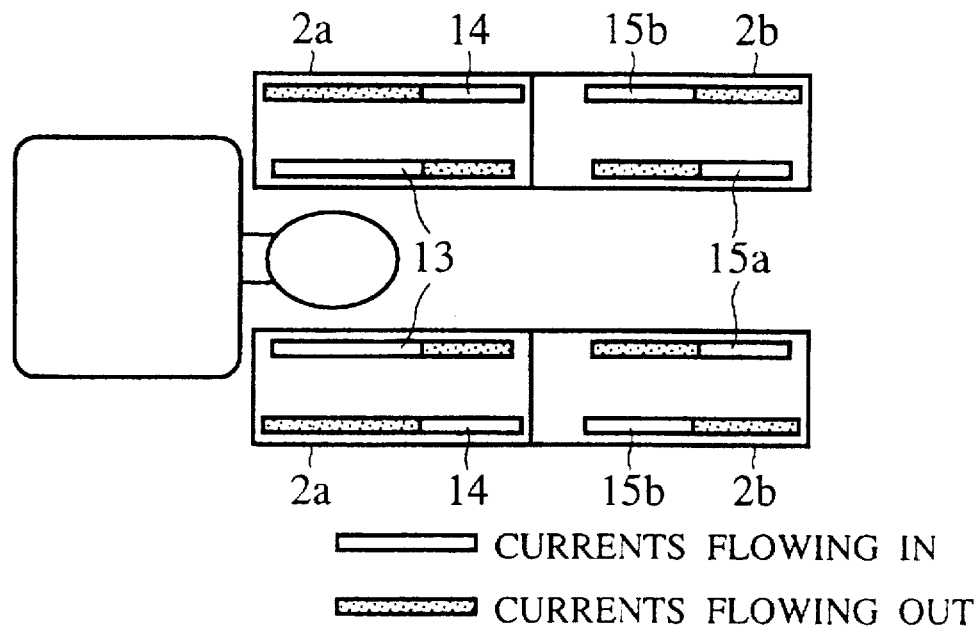
FIG. 5 is a cross sectional view of an asymmetric torque-free active shield gradient coil according to the first embodiment of the present invention.

FIG. 5 shows a configuration of the asymmetric torque-free active shield G coil (for X or Y channel) in this first embodiment. Note that the Z channel G coil has no current return as in X or Y channel G coil in principle, so that the Z channel G coil has no contribution to the imaging field of view.

This G coil of FIG. 5 has an asymmetric ASGC 2a for forming the effective gradient field (which determines the imaging field of view in which a head portion of a patient is to be placed as shown in FIG. 5), which is formed by a primary coil 13 and a shield coil 14.

In addition, adjacent to this asymmetric ASGC 2a, there is also provided a complete shielding type torque cancellation coil 2b in order to cancel the torque generated in the asymmetric ASGC 2a. This torque cancellation coil 2b is formed by a torque cancellation primary coil 15a and a torque cancellation shield coil 15b, similarly as the asymmetric ASGC 2a.

Here, the contribution to the gradient field formation from this torque cancellation coil 2b is made substantially ignorable, and the leakage magnetic field from the torque cancellation coil 2b is made substantially zero. Namely, the asymmetric ASGC 2a is designed in advance to have a current profile which can substantially cancel out a gradient field contribution from the torque cancellation coil 2b.

Consequently, this G coil of FIG. 5 can satisfy all the conditions regarding the the imaging region required for an imaging of an entire head portion, the leakage magnetic field shielding property, and the torque cancellation.

Figure 6:
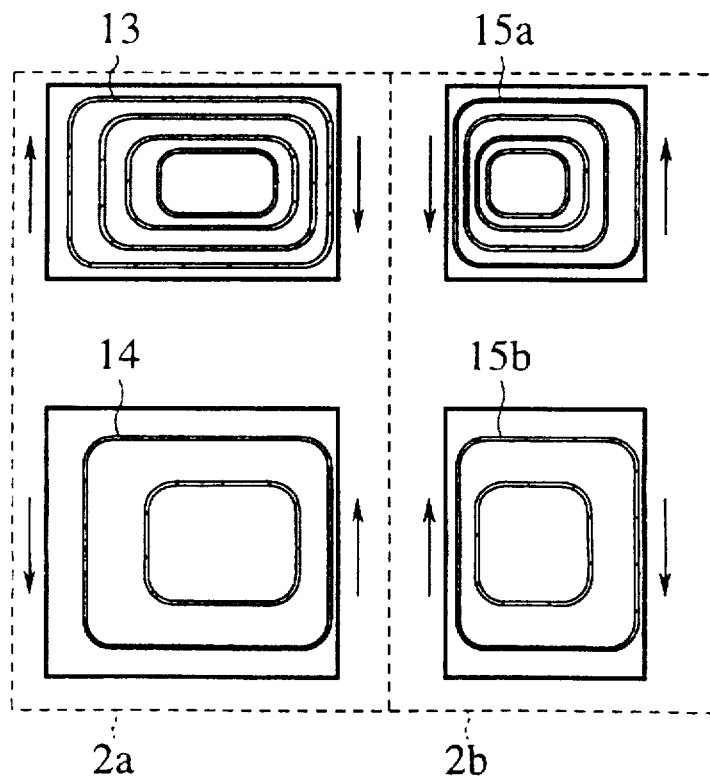
FIG. 6 is a diagram showing current patterns in the asymmetric torque-free active shield gradient coil of FIG. 5.

FIG. 6 shows current patterns in various sections of this G coil of FIG. 5. Here, the current pattern is basically the fingerprint shaped pattern in every section. In FIG. 6, arrows indicate relative relationship of current directions.

Figure 7:
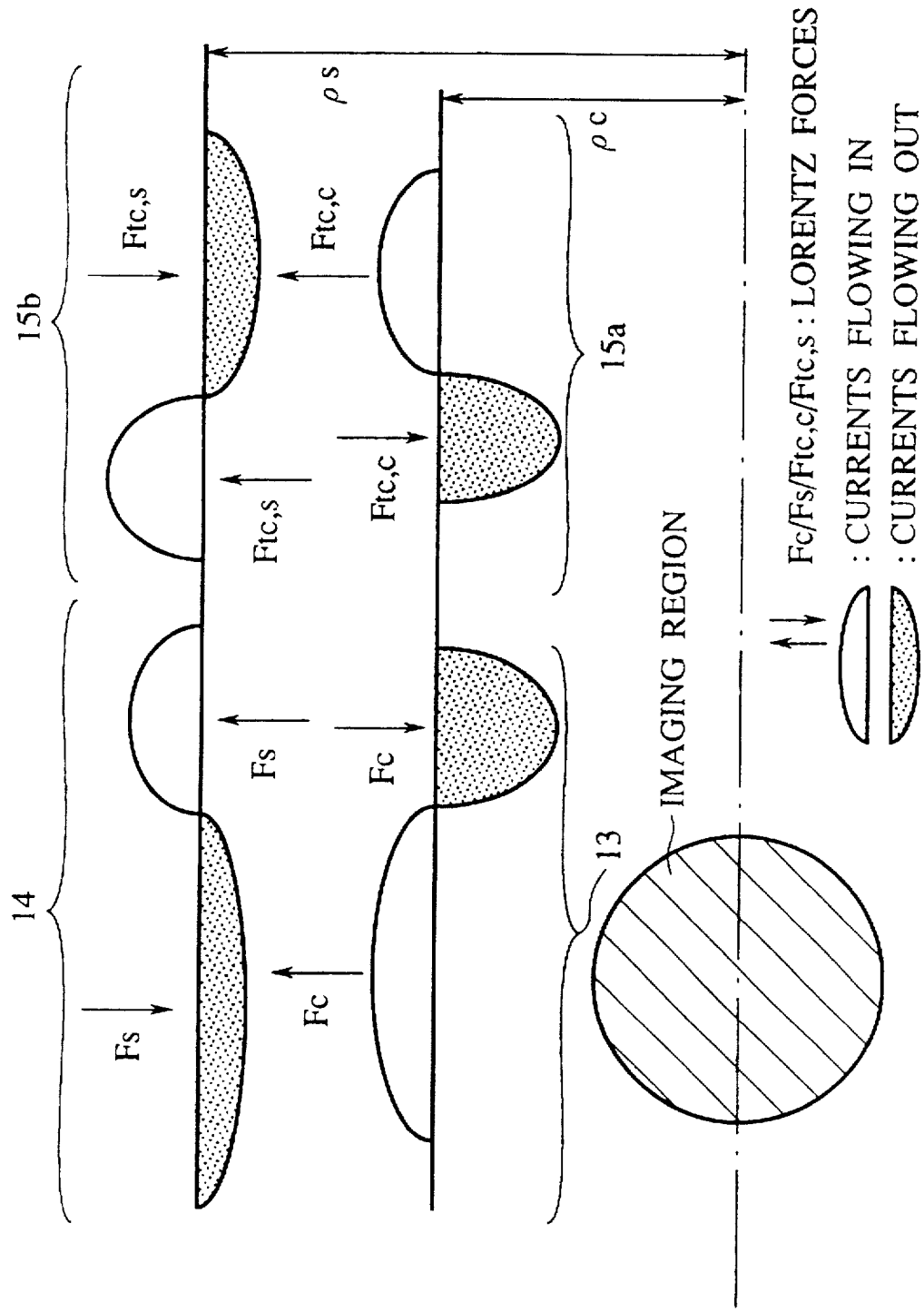
FIG. 7 is a diagram showing a relationship between current distributions and Lorentz forces in the asymmetric torque-free active shield gradient coil of FIG. 5.

FIG. 7 shows a relationship between the current distributions and the Lorentz forces in the G coil of FIG. 5. In FIG. 7, Fc represents the Lorentz force acting on the primary coil 13 of the asymmetric ASGC 2a. Fs represents the Lorentz force acting on the shield coil 14 of the asymmetric ASGC 2a, Ftc,c represents the Lorentz force acting on the torque cancellation primary coil 15a of the torque cancellation coil 2b, and Ftc,s represents the Lorentz force acting on the torque cancellation shield coil 15b of the torque cancellation coil 2b. Also, ρc is a radius from a center of gravity of conductors for the primary coil 13 and the torque cancellation primary coil 15a, ρs is a radius from a center of gravity of conductors for the shield coil 14 and the torque cancellation shield coil 15b.

Now, with reference also to a three dimensional coordinate diagram of FIG. 8, a concrete condition for the cancellation of torque due to the Lorentz forces shown in FIG. 7 will be described more specifically.

Figure 8:
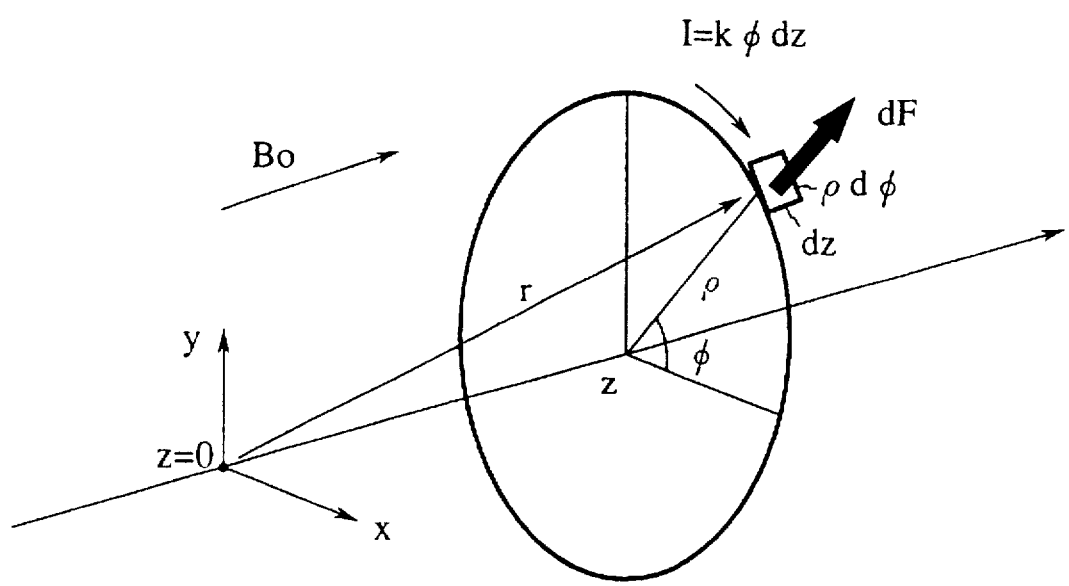
FIG. 8 is a three dimensional coordinate diagram for explaining the Lorentz force in the diagram of FIG. 7.

As shown in FIG. 8, the Lorentz force dF acting on a current element $I\rho/d\phi$ in the $\phi$ direction within a static magnetic field $B_0$ can be expressed by the following equation (1). Here, the static magnetic field $B_0$ is expressed as $B_0(\rho, \phi, z)$ because the static magnetic field in the axial direction of a magnet may not necessarily be homogeneous in general and may have some spatial dependency.

$$dF = (B_z(\rho, \phi, z)k_\phi dz\rho d\phi \cos\phi,$$

$$B_z(\rho, \phi, z)k_\phi dz\rho d\phi \sin\phi, 0) \qquad (1)$$

where $k_\phi$ is a current density in the $\phi$ direction so that $I=k_\phi dz$.

On the other hand, a position vector r shown in FIG. 8 is a vector from an origin to the above current element $I\rho/d\phi$, which can be expressed by the following equation (2).

$$r=(\rho\cos\phi, \rho\sin\phi, z) \qquad (2)$$

Therefore, the torque due to the above Lorentz force dF with respect to the origin can be expressed by the following equation (3).

$$dF_c \times r = (B_d(\rho, \phi, z)k_\phi\rho z \sin\phi d\phi dz,$$
$$-B_d(\rho, \phi, z)k_\phi\rho z \cos\phi d\phi dz, 0) \qquad (3)$$

From the above, it follows that the torque cancellation condition for the asymmetric torque-free active shield G coil of FIG. 5 can be expressed by the following equation (4).

$$\int_0^{2\pi}\int_{z_c} dF_c \times r_c + \int_0^{2\pi}\int_{z_s} dF_s \times r_s + \qquad (4)$$
$$\int_0^{2\pi}\int_{z_{tc,c}} dF_{tc,c} \times r_{tc,c} + \int_0^{2\pi}\int_{z_{tc,s}} dF_{tc,s} \times r_{tc,s} = 0$$

where subscripts c, s, tc.c, and tc.s correspond to the primary coil 13, the shield coil 14, the torque cancellation primary coil 15a, and the torque cancellation shield coil 15b of FIG. 5. Here, a range of integration for a variable z in each term corresponds to a range of the current distribution in the z direction of a corresponding coil member in FIG. 5. This equation (4) can be used as the constraint condition at a time of designing the G coil of FIG. 5.

Next, the second embodiment of the asymmetric torque-free active shield gradient coil according to the present invention will be described in detail. Here, the elements substantially equivalent to those of the first embodiment described above will given the same reference numerals in the figure.

Figure 9:
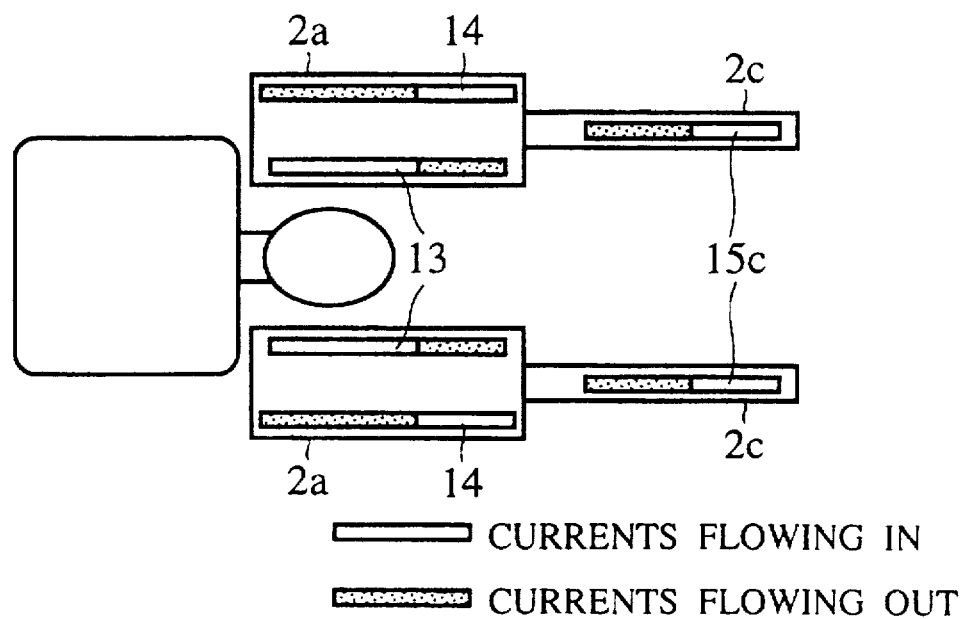
FIG. 9 is a cross sectional view of an asymmetric torque-free active shield gradient coil according to the second embodiment of the present invention.

FIG. 9 shows a configuration of the asymmetric torque-free active shield G coil (for X or Y channel) in this second embodiment. The reason why this G coil of FIG. 9 is used only for the X and Y channels is the same as in the first embodiment.

In contrast to the first embodiment of FIG. 5 which uses the complete shielding type torque cancellation coil 2b, this second embodiment of FIG. 9 uses a non-shielding fingerprint type torque cancellation coil 2c. This non-shielding fingerprint type torque cancellation coil 2c is formed by a single torque cancellation coil 15c as shown in FIG. 9. The rest of the configuration of this G coil of FIG. 9 are substantially the same as that of FIG. 5.

The above described first embodiment has an advantage in that the leakage magnetic field from the torque cancellation coil is also completely shielded. On the other hand, as should be apparent from FIG. 5, this G coil of FIG. 5 also have disadvantages in that: (1) a weight of the torque cancellation coil (including a weight of conductor) increases considerably so that the maneuverability of the G coil as an option to be installed in the MRI for whole body imaging is low; (2) the inductance of the torque cancellation coil is large because it is the complete shielding type so that the gradient field switching performance is inferior; and (3) the designing and manufacturing of the G coil is not so easy, and a high cost may be required for this G coil.

Actually, the gradient field contribution and the residual eddy current magnetic field of the torque cancellation coil can be accounted by designing the configuration and the arrangement of the ASGC coil and the torque cancellation coil to cancel them out. Consequently, in this second embodiment, the non-shielding fingerprint type torque cancellation coil is used to achieve significant reduction of weight, inductance, and cost, while realizing the effective torque cancellation.

Figure 10:
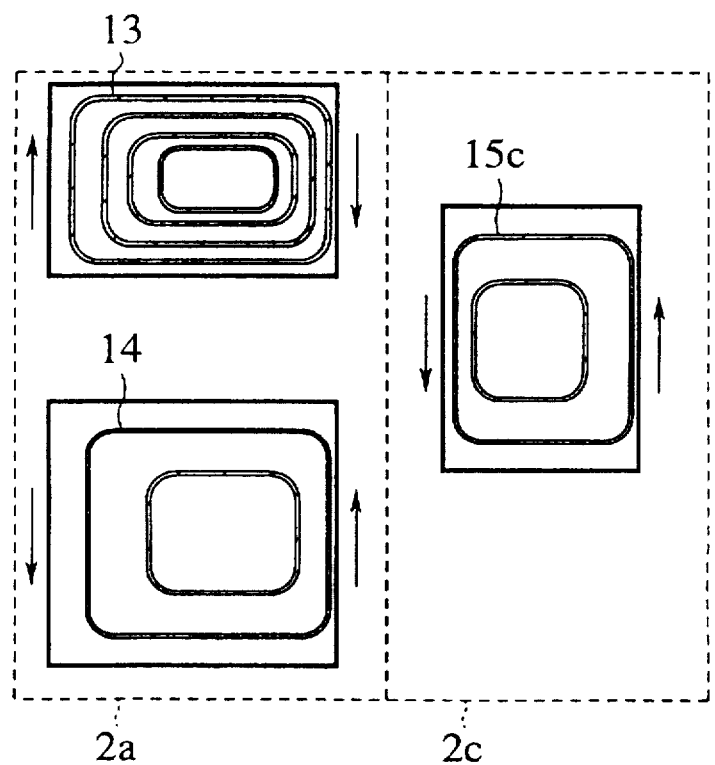
FIG. 10 is a diagram showing current patterns in the asymmetric torque-free active shield gradient coil of FIG. 9.

FIG. 10 shows current patterns in various sections of this G coil of FIG. 9. Here, again, the current pattern is basically the fingerprint shaped pattern in every section, just as in the first embodiment. In FIG. 10, arrows indicate relative relationship of current directions. Here, in the asymmetric ASGC 2a side, the ampere turn of the primary coil 13 is larger than that of the shield coil 14, so that the current direction of the torque cancellation coil 15c is opposite to that of the primary coil 13 of the asymmetric ASGC 2a.

Figure 11:
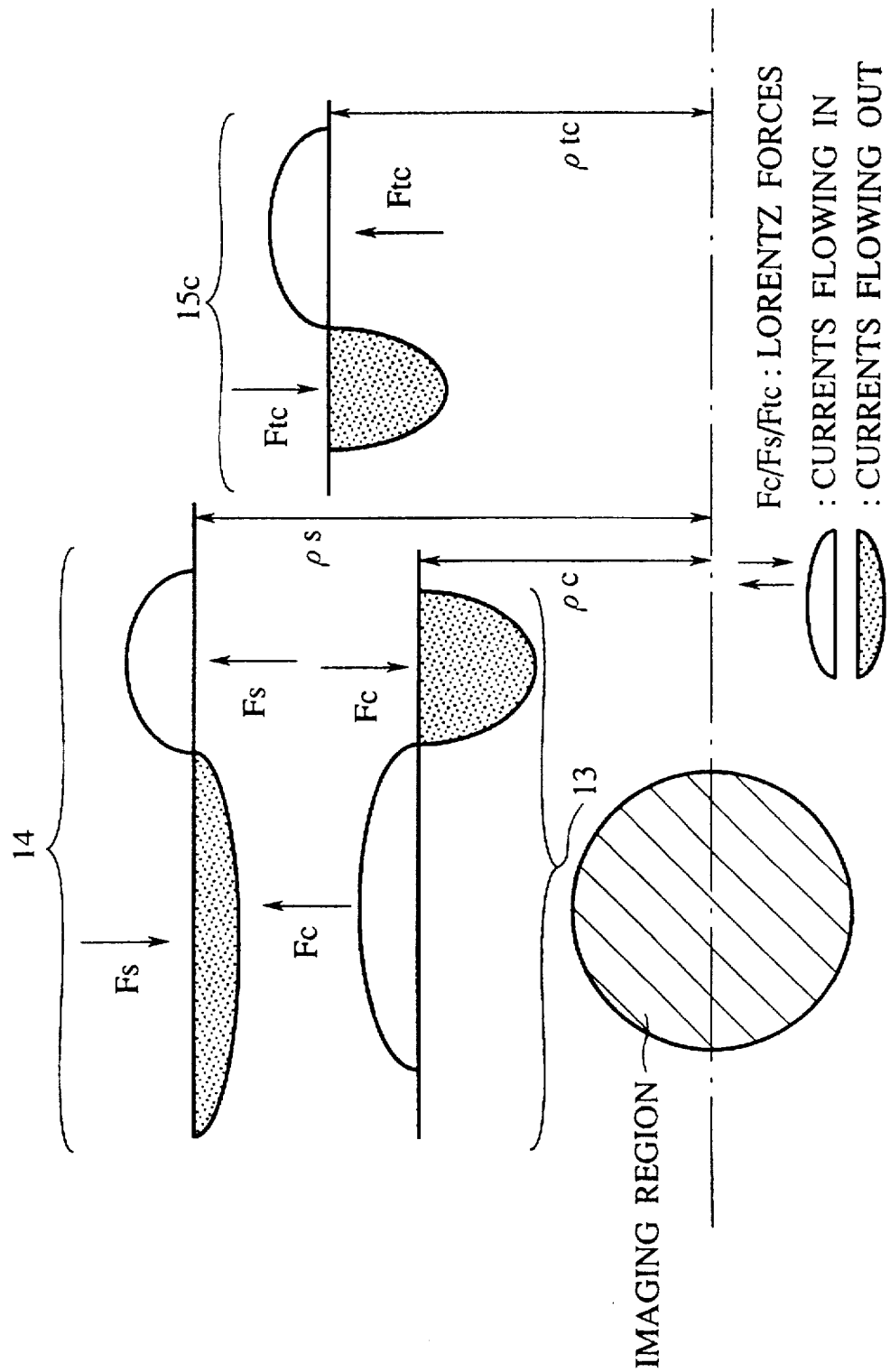
FIG. 11 is a diagram showing a relationship between current distributions and Lorentz forces in the asymmetric torque-free active shield gradient coil of FIG. 9.

FIG. 11 shows a relationship between the current distributions and the Lorentz forces in the G coil of FIG. 9. In FIG. 11, Fc represents the Lorentz force acting on the primary coil 13 of the asymmetric ASGC 2a, Fs represents the Lorentz force acting on the shield coil 14 of the asymmetric ASGC 2a, and Ftc represents the Lorentz force acting on the torque cancellation coil 15c. Also, $\rho c$ is a radius from a center of gravity of a conductor for the primary coil 13, $\rho s$ is a radius from a center of gravity of a conductor for the shield coil 14, and $\rho tc$ is a radius from a center of gravity of a conductor for the torque cancellation coil 15c.

Therefore, the torque cancellation condition for this asymmetric torque-free active shield G coil of FIG. 9 can be expressed by the following equation (5), similarly as in a case of the first embodiment.

$$\int_0^{2\pi}\int_{z_c} dF_c \times r_c + \int_0^{2\pi}\int_{z_s} dF_s \times r_s + \qquad (5)$$
$$\int_0^{2\pi}\int_{z_{tc}} dF_{tc} \times r_{tc} = 0$$

where subscripts c, s, and tc correspond to the primary coil 13, the shield coil 14, and the torque cancellation coil 15c of FIG. 9. Here, a range of integration for a variable z in each term corresponds to a range of the current distribution in the z direction of a corresponding coil member in FIG. 9.

In principle, as the center of gravity of the non-shielding fingerprint type torque cancellation coil 2c is positioned further away from the asymmetric ASGC 2a, the gradient field contribution and the residual eddy current magnetic field strength from this torque cancellation coil 2c decrease, while the torque and the inductance are unchanged. On the other hand, when the current distribution range of the torque cancellation coil 2c is narrowed while the center of gravity is maintained, a number of ampere turns required for the torque cancellation, i.e., the inductance, of the torque cancellation coil 2c increases.

By designing the non-shielding fingerprint type torque cancellation coil 2c in view of these various dependencies, it is possible to realize the asymmetric torque-free active shield G coil with significant reduction of weight, inductance, and cost, in which the gradient field contribution and the residual eddy current magnetic field strength from the torque cancellation coil 2c are ignorable. Note that the radius $\rho tc$ of the center of gravity of the conductor for the torque cancellation coil 2c is also a parameter that can be changed in designing the torque cancellation coil 2c, and it can also be determined appropriately in view of the inductance, the gradient field contribution, and the residual eddy current magnetic field strength of the torque cancellation coil 2c, as well as the structural conditions of the asymmetric ASGC 2a.

Next, the third embodiment of the asymmetric torque-free active shield gradient coil according to the present invention will be described in detail. Here, the elements substantially equivalent to those of the embodiments described above will given the same reference numerals in the figure.

Figure 12:
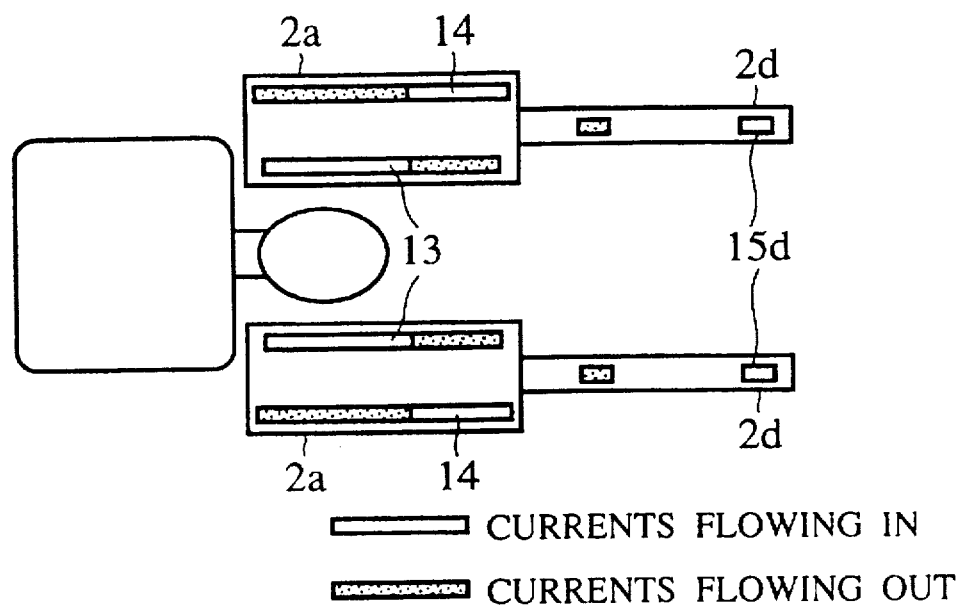
FIG. 12 is a cross sectional view of an asymmetric torque-free active shield gradient coil according to the third embodiment of the present invention.

FIG. 12 shows a configuration of the asymmetric torque-free active shield G coil (for X or Y channel) in this third embodiment. The reason why this G coil of FIG. 12 is used only for the X and Y channels is the same as in the first embodiment.

In contrast to the second embodiment of FIG. 9 which uses the non-shielding fingerprint type torque cancellation coil 2c, this third embodiment of FIG. 12 uses a non-shielding saddle type torque cancellation coil 2d. This non-shielding saddle type torque cancellation coil 2d is formed by a single torque cancellation coil 15d as shown in FIG. 12. The rest of the configuration of this G coil of FIG. 12 are substantially the same as that of FIG. 9.

Thus, the only difference from the second embodiment is that the non-shielding torque cancellation coil is changed from the fingerprint type to the saddle type. For this reason, in comparison with the second embodiment, this third embodiment has advantages in that: (1) the coil can be densely wound in a saddle shape so that the axial length of the torque cancellation coil can be further shortened and the weight of the torque cancellation coil can be further reduced; (2) the coil can be densely wound in a saddle shape so that the current portion on the asymmetric ASGC 2a side of the torque cancellation coil can be positioned further away from the asymmetric ASGC 2a and therefore the gradient field contribution and the residual eddy current magnetic field strength from the torque cancellation coil can be lowered further; and (3) the designing and manufacturing of the G coil becomes easier so that the cost required for the G coil can be reduced further.

Figure 13:
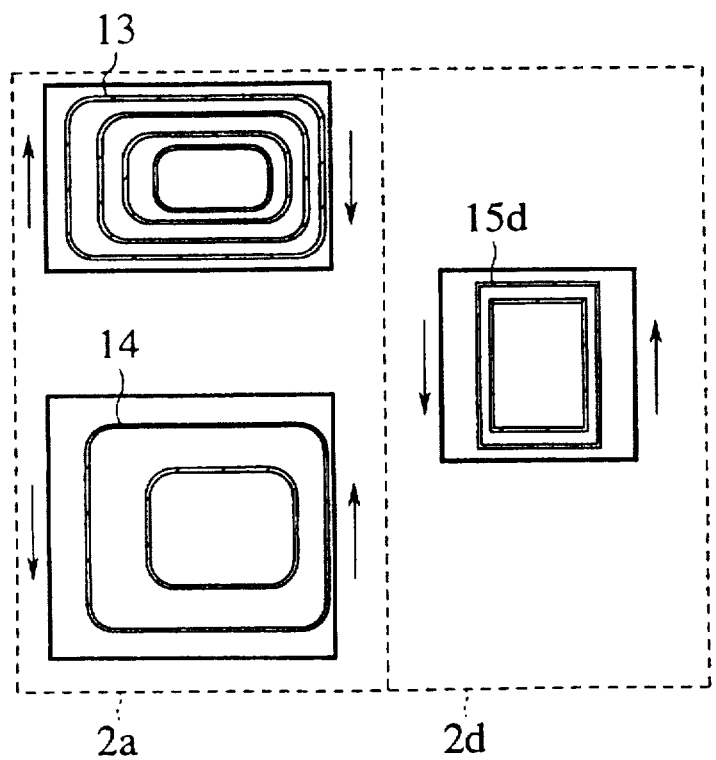
FIG. 13 is a diagram showing current patterns in the asymmetric torque-free active shield gradient coil of FIG. 12.

FIG. 13 shows current patterns in various sections of this G coil of FIG. 12. Here, the current pattern for the asymmetric ASGC 2a is basically the fingerprint shaped pattern, while the current pattern for the torque cancellation coil 2d is basically the saddle shaped pattern. In FIG. 13, arrows indicate relative relationship of current directions. Here, in the asymmetric ASGC 2a side, the ampere turn of the primary coil 13 is larger than that of the shield coil 14, so that the current direction of the torque cancellation coil 15d is opposite to that of the primary coil 13 of the asymmetric ASGC 2a, similarly as in the second embodiment.

Figure 14:
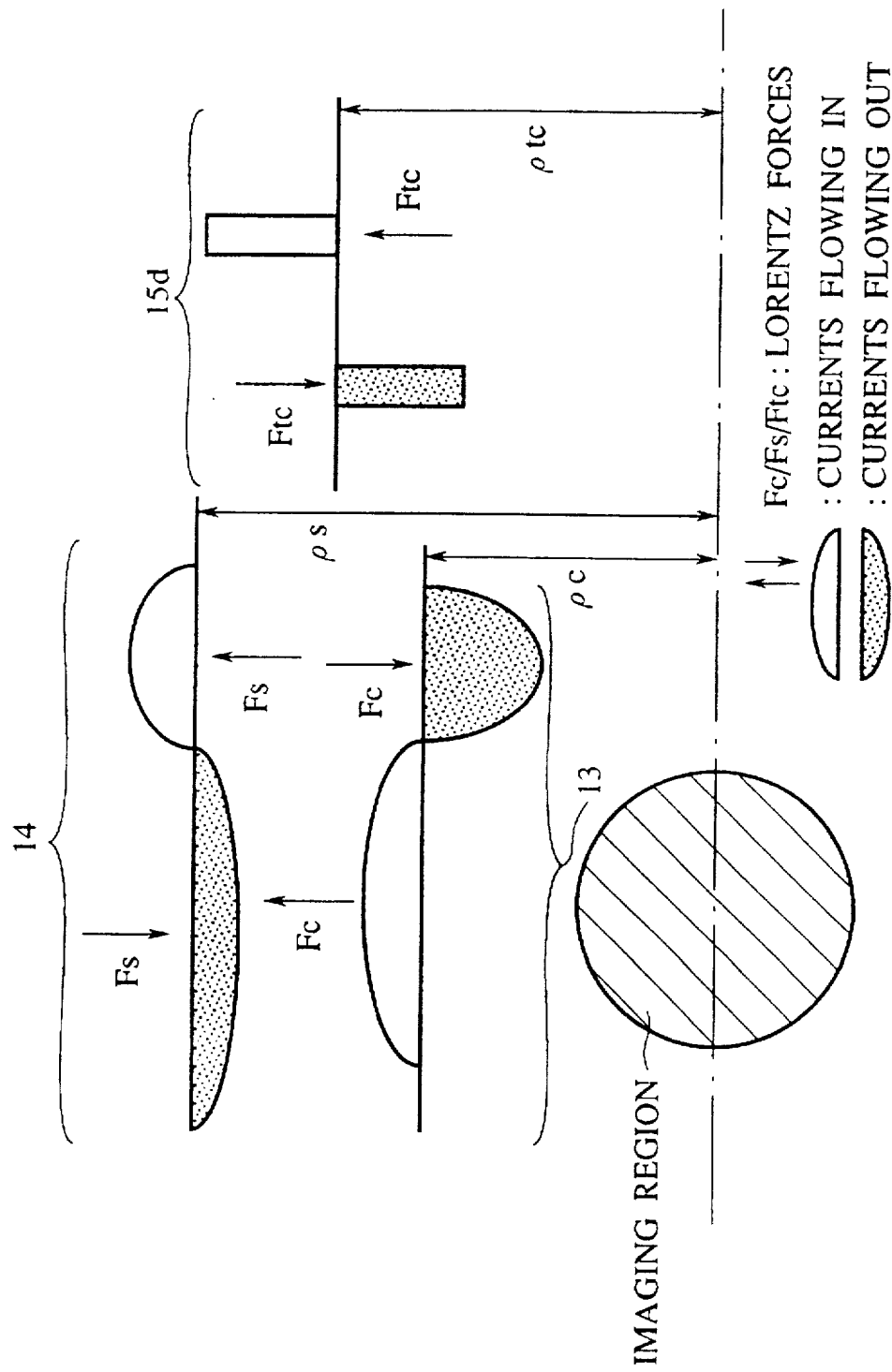
FIG. 14 is a diagram showing a relationship between current distributions and Lorentz forces in the asymmetric torque-free active shield gradient coil of FIG. 12.

FIG. 14 shows a relationship between the current distributions and the Lorentz forces in the G coil of FIG. 12. This FIG. 14 is similar to FIG. 11 for the second embodiment except that the current distribution of the torque cancellation coil 2d of this third embodiment is different from that of the torque cancellation coil 2c of the second embodiment.

Therefore, the torque cancellation condition and the other design conditions for this asymmetric torque-free active shield G coil of FIG. 12 are the same as in a case of the second embodiment.

Next, the fourth embodiment of the asymmetric torque-free active shield gradient coil according to the present invention will be described in detail. Here, the elements substantially equivalent to those of the embodiments described above will given the same reference numerals in the figure.

Figure 15:
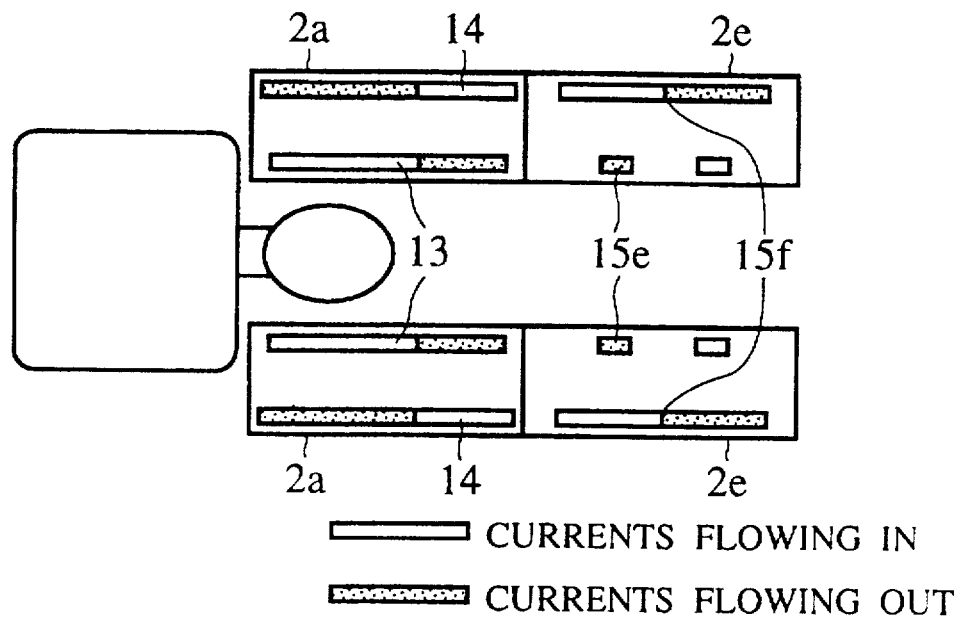
FIG. 15 is a cross sectional view of an asymmetric torque-free active shield gradient coil according to the fourth embodiment of the present invention.

FIG. 15 shows a configuration of the asymmetric torque-free active shield G coil (for X or Y channel) in this fourth embodiment. The reason why this G coil of FIG. 12 is used only for the X and Y channels is the same as in the first embodiment.

This fourth embodiment of FIG. 15 uses a complete shielding type torque cancellation coil 2e, which is formed by a saddle type torque cancellation primary coil 15e and a fingerprint type torque cancellation shield coil 15f as shown in FIG. 15. The rest of the configuration of this G coil of FIG. 15 are substantially the same as that of FIG. 5.

This G coil of FIG. 15 can completely suppress the eddy current magnetic field from the torque cancellation coil 2e, just as in the first embodiment of FIG. 5. Moreover, because of the use of the saddle type torque cancellation primary coil 15e, in comparison with the first embodiment, this fourth embodiment also has advantages in that: (1) the coil can be densely wound in a saddle shape so that the axial length of the torque cancellation coil can be considerably shortened and the weight of the torque cancellation coil can be considerably reduced; and (2) the designing and manufacturing of the G coil becomes easier so that the cost required for the G coil can be reduced.

Figure 16:
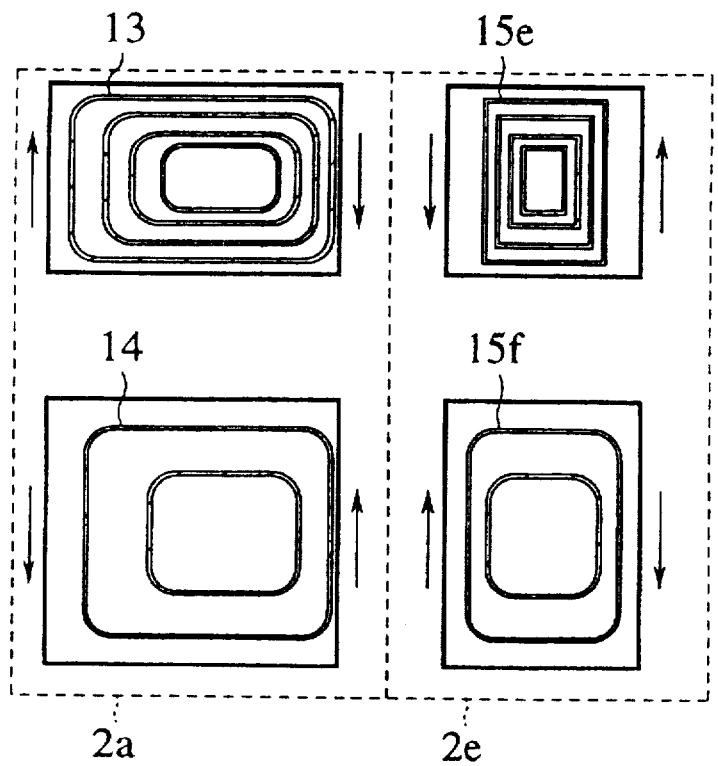
FIG. 16 is a diagram showing current patterns in the asymmetric torque-free active shield gradient coil of FIG. 15.

FIG. 16 shows current patterns in various sections of this G coil of FIG. 15. Here, the current patterns for the asymmetric ASGC 2a and the torque cancellation shield coil 15f are basically the fingerprint shaped patterns, while the current pattern for the torque cancellation primary coil 15e is basically the saddle shaped pattern. In FIG. 16, arrows indicate relative relationship of current directions.

Figure 17:
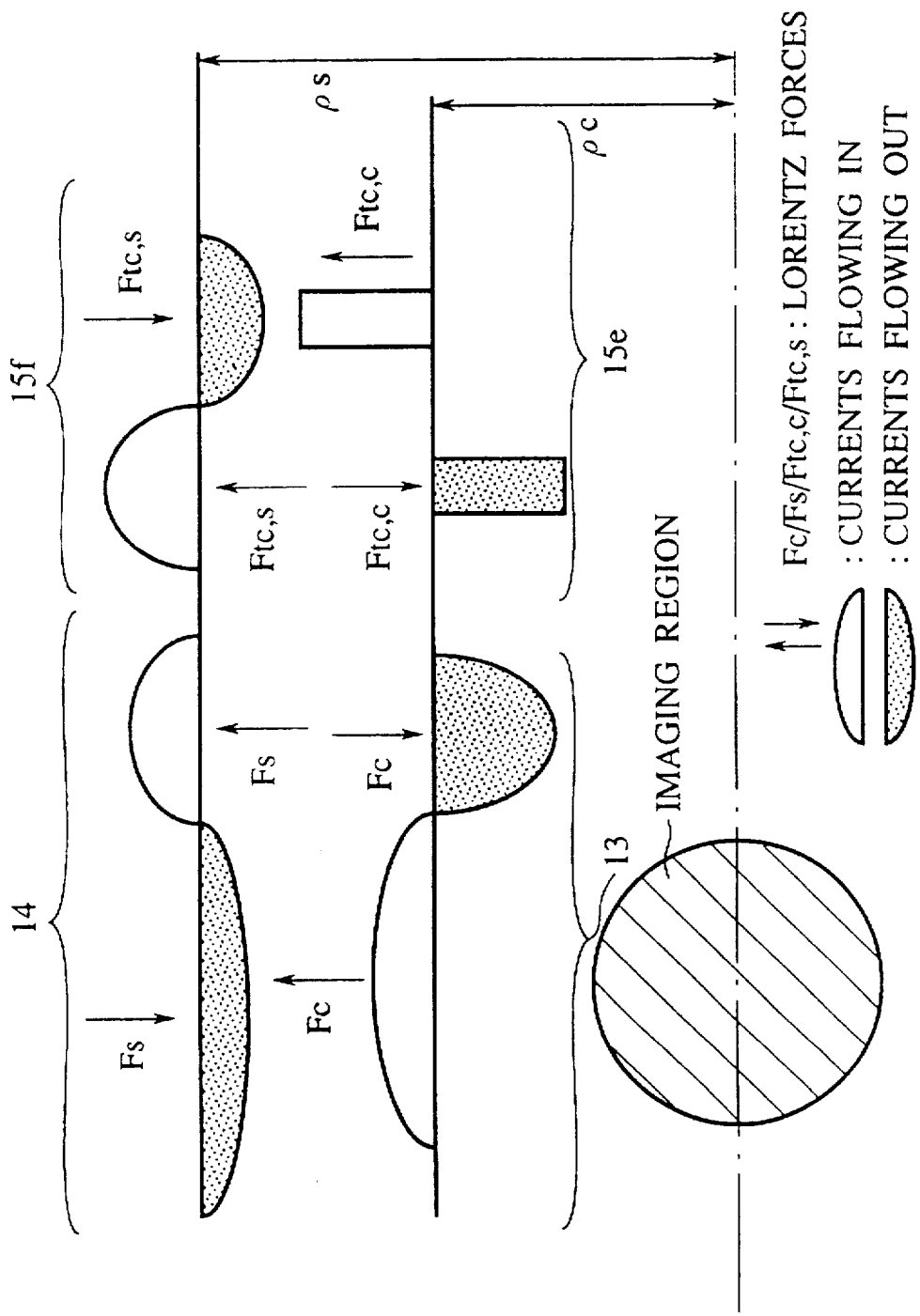
FIG. 17 is a diagram showing a relationship between current distributions and Lorentz forces in the asymmetric torque-free active shield gradient coil of FIG. 15.

FIG. 17 shows a relationship between the current distributions and the Lorentz forces in the G coil of FIG. 15. This FIG. 17 is similar to FIG. 7 for the first embodiment except that the current distribution of the torque cancellation primary coil 15e of this fourth embodiment is different from that of the torque cancellation primary coil 15b of the first embodiment.

Therefore, the torque cancellation condition and the other design conditions for this asymmetric torque-free active shield G coil of FIG. 15 are the same as in a case of the first embodiment.

Note that this fourth embodiment may also be utilized in reducing the weight of the G coil of the fifth and sixth embodiments to be described below.

Next, the fifth embodiment of the asymmetric torque-free active shield gradient coil according to the present invention will be described in detail. Here, the elements similar to those of the embodiments described above will given the similar reference numerals in the figure.

Figure 18:
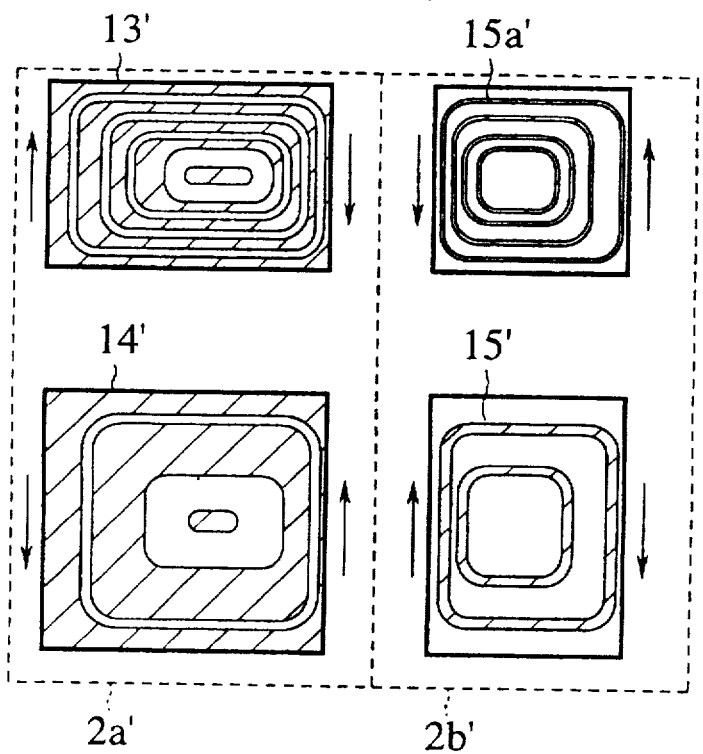
FIG. 18 is a diagram showing coil patterns for an asymmetric torque-free active shield gradient coil according to the fifth embodiment of the present invention.

FIG. 18 shows coil patterns for the asymmetric torque-free active shield G coil (for X or Y channel) in this fifth embodiment, which uses the complete shielding type torque cancellation coil similarly as in the first embodiment but which is formed differently. This G coil of FIG. 18 is only for the X and Y channels for the same reason as in the first embodiment.

In this fifth embodiment, the primary coil 13' and the shield coil 14' of the asymmetric ASGC 2a' have coil patterns formed by etching manufactured conductors as shown in FIG. 18, in order to realize the improved gradient field property, the improved leakage magnetic field shielding property, and the reduced resistance. In FIG. 18, shaded regions indicate conductor portions, and blank regions indicate etched portions.

On the other hand, the torque cancellation primary coil 15a' and the torque cancellation shield coil 15b' of the complete shielding type torque cancellation coil 2b' have coil patterns formed by constant width conductors as shown in FIG. 18, in order to reduce the weight of the torque cancellation coil 2b'. Here, these coil patterns for the torque cancellation coil 2b' may be formed by the etching manufacturing process similar to that used for forming the coil patterns of the asymmetric ASGC 2a', or by using premanufactured constant width conductors.

In a case of using the copper as the conductor, this configuration can leads to a significant reduction of weight because the specific gravity of the copper is quite large.

Next, the sixth embodiment of the asymmetric torque-free active shield gradient coil according to the present invention will be described in detail. Here, the elements substantially equivalent to those of the embodiments described above will given the same reference numerals in the figure.

Figure 19:
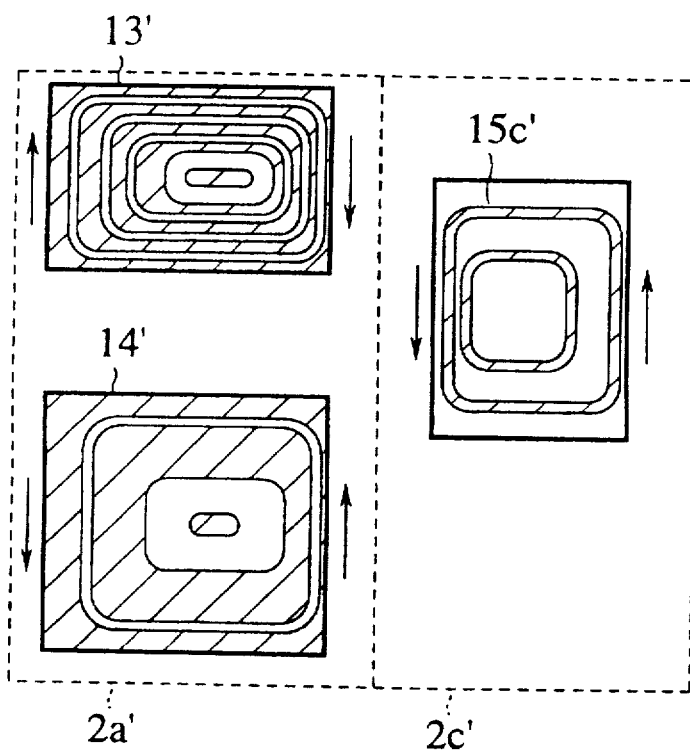
FIG. 19 is a diagram showing coil patterns for an asymmetric torque-free active shield gradient coil according to the sixth embodiment of the present invention.

FIG. 19 shows coil patterns for the asymmetric torque-free active shield G coil (for X or Y channel) in this sixth embodiment, which uses the non-shielding fingerprint type torque cancellation coil similarly as in the second embodiment but which is formed differently. This G coil of FIG. 19 is only for the X and Y channels for the same reason as in the first embodiment.

In this sixth embodiment, the primary coil 13' and the shield coil 14' of the asymmetric ASGC 2a' are formed as conductor covered patterns obtained by the etching manufacturing process, while the torque cancellation coil 15c' is formed as constant width conductors, just as in the fifth embodiment. In FIG. 19, the shaded regions are covered by conductors, and the blank regions are formed by he etching, just as in FIG. 18.

This configuration can leads to a significant reduction of weight, just as in the fifth embodiment.

Next, the seventh embodiment of the asymmetric torque-free active shield gradient coil according to the present invention will be described in detail. Here, the elements substantially equivalent to those of the embodiments described above will given the same reference numerals in the figure.

Figure 20:
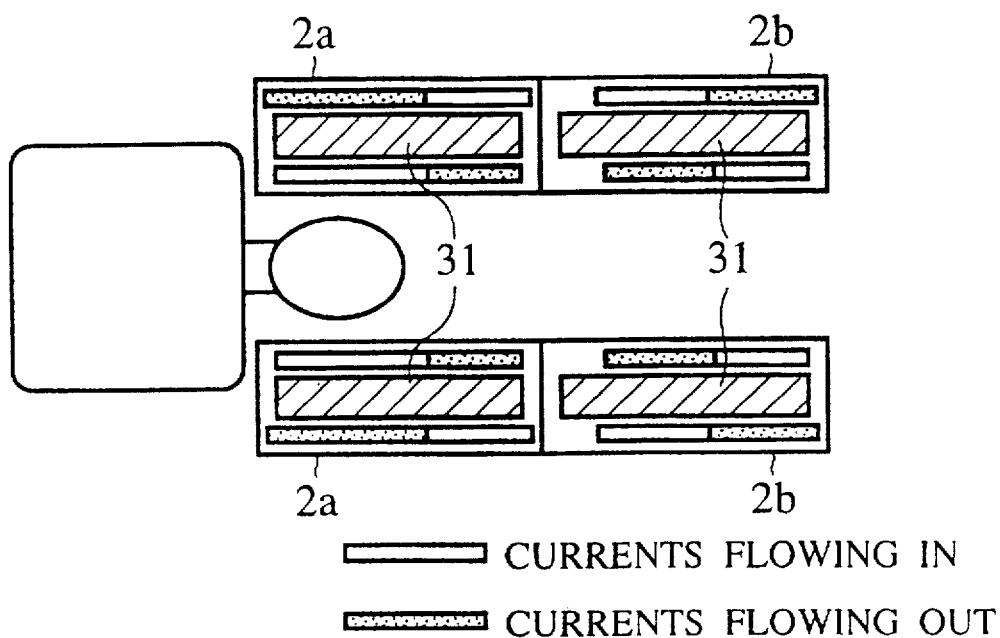
FIG. 20 is a cross sectional view of one possible configuration for an asymmetric torque-free active shield gradient coil according to the seventh embodiment of the present invention.
Figure 21:
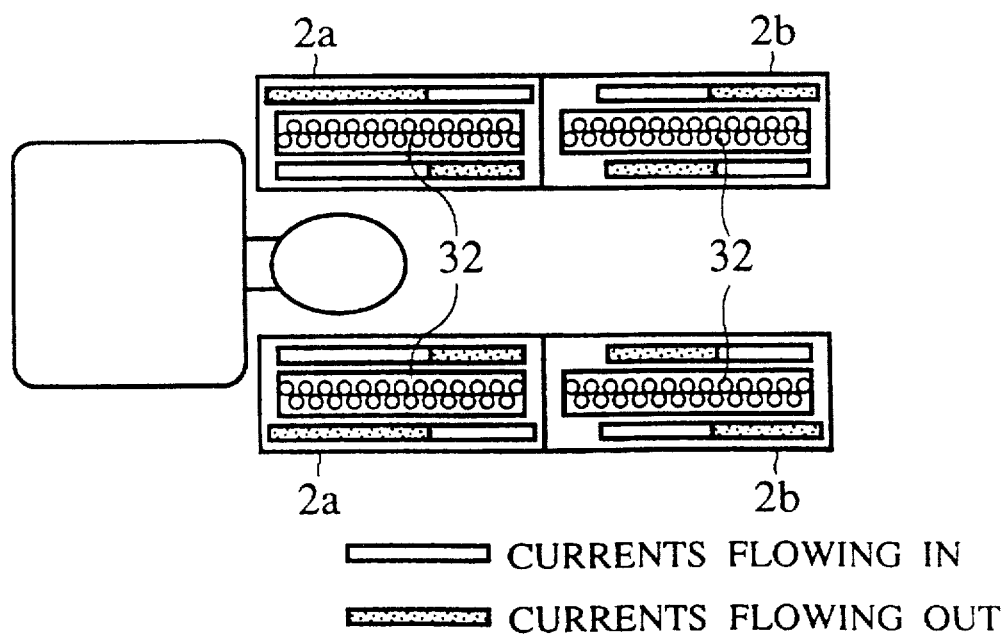
FIG. 21 is a cross sectional view of another possible configuration for an asymmetric torque-free active shield gradient coil according to the seventh embodiment of the present invention.

FIG. 20 and FIG. 21 show two possible configurations of the asymmetric torque-free active shield G coil (for X or Y channel) in this seventh embodiment, which is a modification of the first embodiment of FIG. 5 concerning a reduction of weight and a cooling of the G coil.

Namely, in the configuration of FIG. 20, hollow spacers 31 are inserted into a structurally open space between the primary coil and the shield of the asymmetric ASGC 2a and a structurally open space between the torque cancellation primary coil and the torque cancellation shield coil of the torque cancellation coil 2b, so as to reduce the weight of the G coil as a whole.

On the other hand, in the configuration of FIG. 21, hollow tubes 32 such as Teflon tubes are wound around the primary coil of the asymmetric ASGC 2a at a structurally open space between the primary coil and the shield of the asymmetric ASGC 2a and around the torque cancellation primary coil of the torque cancellation coil 2b at a structurally open space between the torque cancellation primary coil and the torque cancellation shield coil of the torque cancellation coil 2b, so as to reduce the weight of the G coil as a whole. By circulating coolant such as water through these hollow tubes 32, it is possible to utilize these hollow tubes 32 as means for cooling the G coil.

Next, the eighth embodiment of the asymmetric torque-free active shield gradient coil according to the present invention will be described in detail. Here, the elements substantially equivalent to those of the embodiments described above will given the same reference numerals in the figure.

Figure 22:
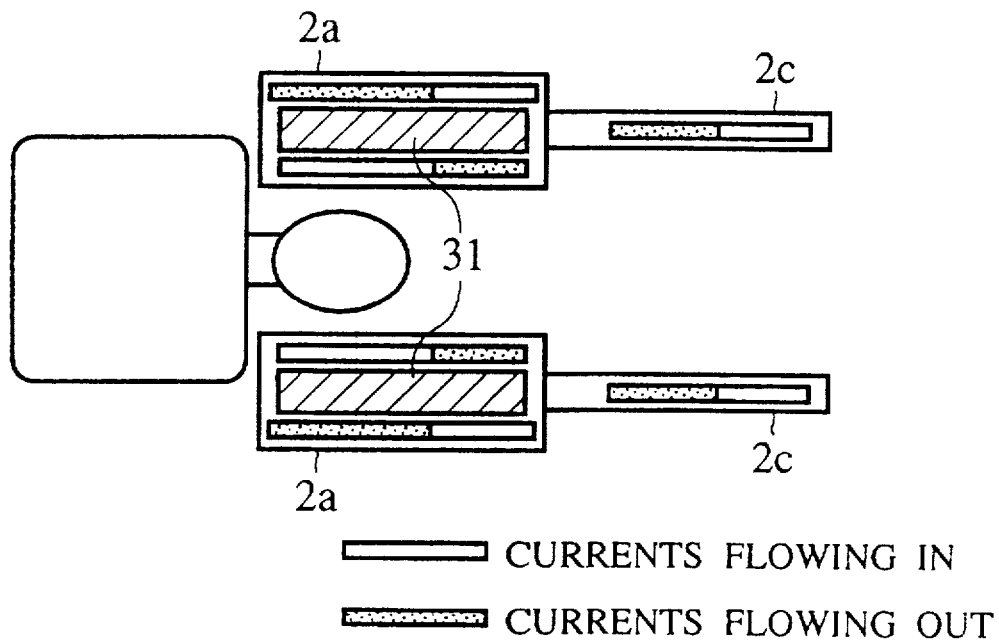
FIG. 22 is a cross sectional view of one possible configuration for an asymmetric torque-free active shield gradient coil according to the eighth embodiment of the present invention.
Figure 23:
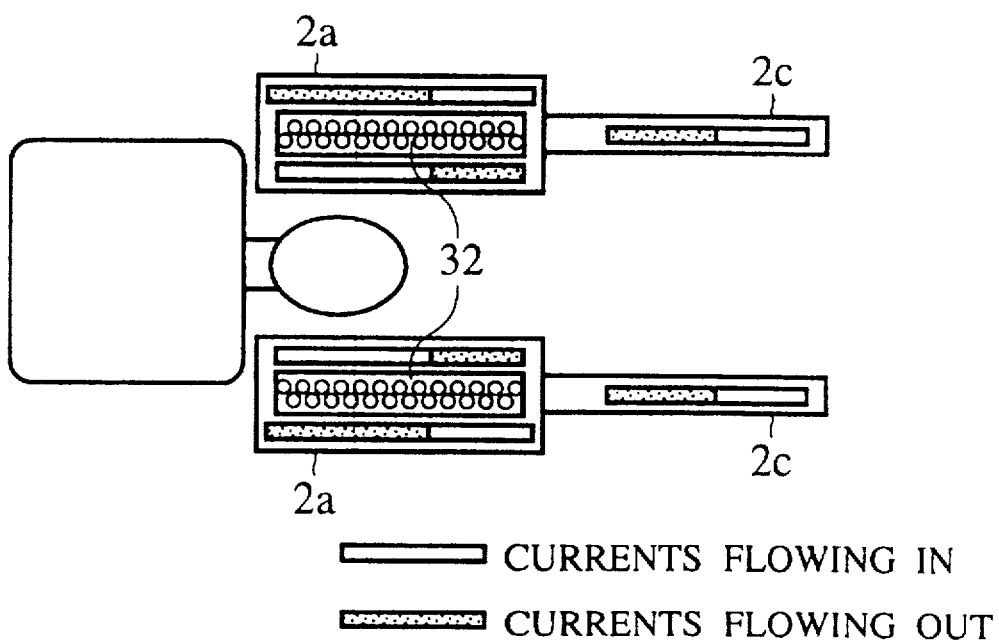
FIG. 23 is a cross sectional view of another possible configuration for an asymmetric torque-free active shield gradient coil according to the eighth embodiment of the present invention.

FIG. 22 and FIG. 23 show two possible configurations of the asymmetric torque-free active shield G coil (for X or Y channel) in this eighth embodiment, which is a modification of the second embodiment of FIG. 9 concerning a reduction of weight and a cooling of the G coil.

Namely, in the configuration of FIG. 22, a hollow spacer 31 is inserted into a structurally open space between the primary coil and the shield of the asymmetric ASGC 2a, so as to reduce the weight of the G coil as a whole.

On the other hand, in the configuration of FIG. 23, a hollow tube 32 such as a Teflon tube is wound around the primary coil of the asymmetric ASGC 2a at a structurally open space between the primary coil and the shield of the asymmetric ASGC 2a, so as to reduce the weight of the G coil as a whole. By circulating coolant such as water through this hollow tube 32, it is possible to utilize this hollow tube 32 as means for cooling the G coil.

In the configurations of FIG. 22 and FIG. 23, it is also possible to incorporate a hollow spacer or a hollow tube on the torque cancellation coil 2c side, in order to reduce the weight of the G coil as a whole further.

Next, the ninth embodiment of a nuclear magnetic resonance imaging apparatus using asymmetric torque-free active shield gradient coil according to the present invention will be described in detail. Here, the elements substantially equivalent to those of the embodiments described above will given the same reference numerals in the figure.

Figure 24:
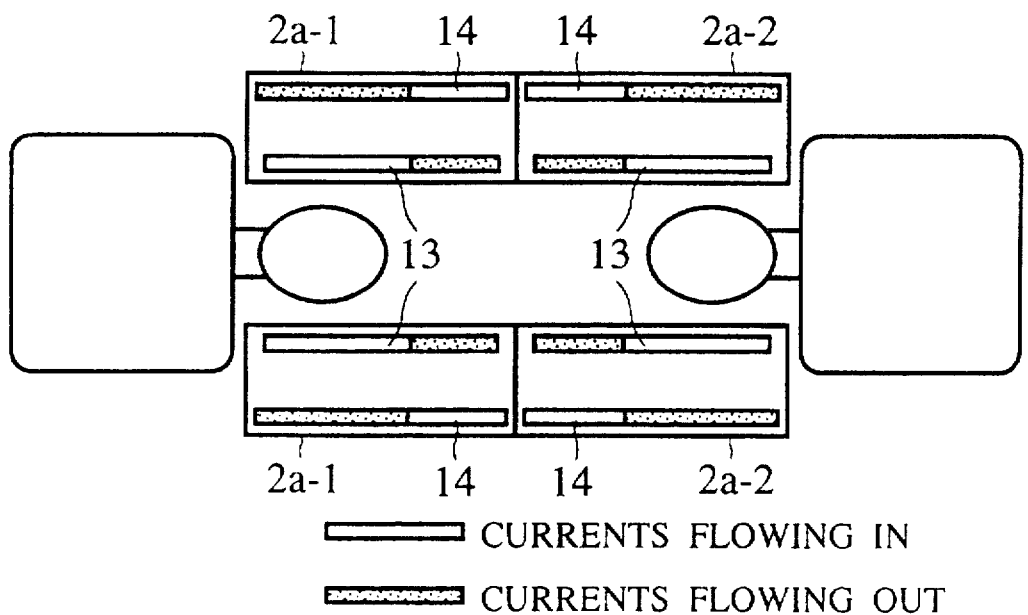
FIG. 24 is a cross sectional view of an asymmetric torque-free active shield gradient coil according to the ninth embodiment of the present invention.
Figure 25:
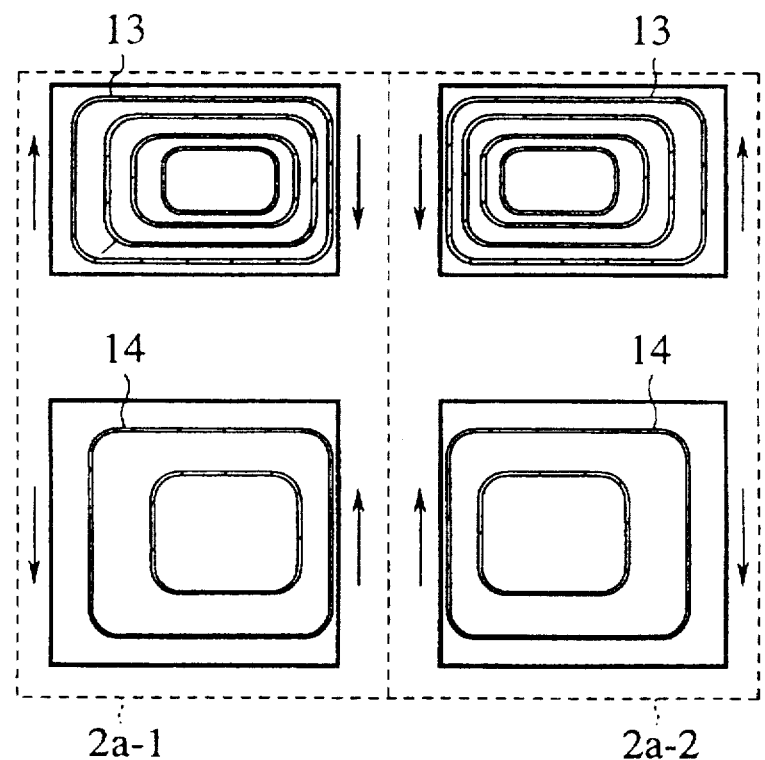
FIG. 25 is a diagram showing current patterns in the asymmetric torque-free active shield gradient coil of FIG. 24.

In this ninth embodiment, the G coil has a configuration as shown in FIG. 24 in which two asymmetric ASGCs 2a (2a-1 and 2a-2) similar to that used in the above embodiments are arranged adjacent to each other in a relation of being a mirror image of each other, i.e., symmetrically with respect to a border between them, such that head portions of two patients can be imaged simultaneously. As can be seen in FIG. 24, each of these two asymmetric ASGCs 2a-1 and 2a-2 is positioned to function as a torque cancellation coil with respect to the other. In addition, as shown in FIG. 25, the current patterns in the G coil are symmetric with respect to a boundary between these two asymmetric ASGCs 2a-1 and 2a-2.

In this G coil of FIG. 24, the inductance is increased twice as much as that of the single asymmetric ASGC, so that the gradient field property is inferior, but it is still possible to expect the several times superior gradient field property than the ASGC for whole body imaging, because of its compactness (provided that the same gradient field power source is used). On the other hand, when the identical pulse sequence are to be used for many patients as in a case of medical brain checkup, it is possible to increase the throughput of the brain imaging process twice, so that the efficiency in the hospital can be improved considerably. For this reason, this G coil of FIG. 24 has a potential for becoming an indispensable technical feature at a time of realizing the MRI specialized for the medical brain checkup in future. In this configuration of FIG. 24, the two asymmetric ASGCs 2a-1 and 2a-2 are usually connected in series and driven together, but it may be possible to drive each asymmetric ASGC independently if desired.

Figure 26:
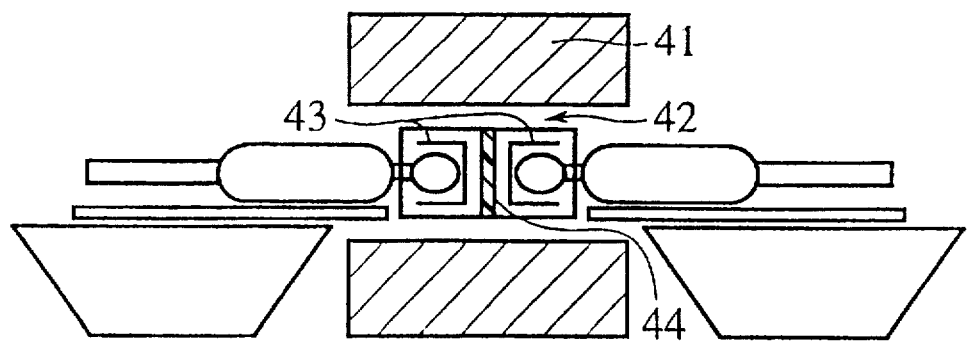
FIG. 26 is a schematic cross sectional view of one possible imaging section configuration for a nuclear magnetic resonance imaging apparatus in the ninth embodiment of the present invention.
Figure 27:
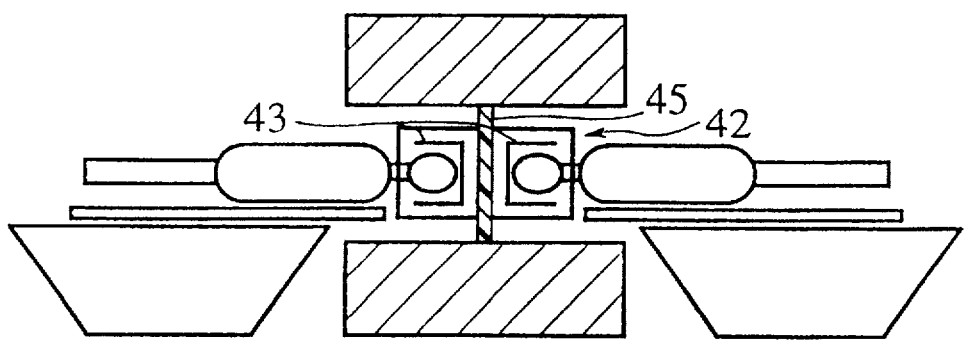
FIG. 27 is a schematic cross sectional view of another possible imaging section configuration for a nuclear magnetic resonance imaging apparatus in the ninth embodiment of the present invention.
Figure 28:
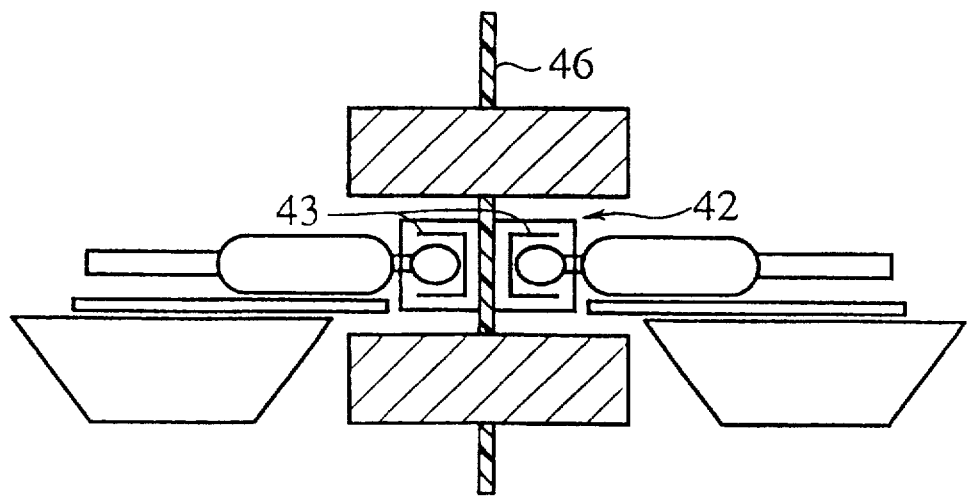
FIG. 28 is a schematic cross sectional view of another possible imaging section configuration for a nuclear magnetic resonance imaging apparatus in the ninth embodiment of the present invention.

FIG. 26, FIG. 27 and FIG. 28 show three possible schematic configurations for an imaging section of a nuclear magnetic resonance imaging apparatus incorporating the G coil of FIG. 24. In each configuration, the G coil 42 of FIG. 24 which can image two patients simultaneously is provided inside a bore of a superconducting magnet 41. Two patients are inserted from opposite ends of the bore of the superconducting magnet 41, head to head, into imaging regions defined by RF coils 43 for head portion provided inside the G coil 42.

Each configuration also incorporates a partition structure 44, 45, or 46 for the purpose of protecting a privacy of each patient. FIG. 26 shows a case of using the partition structure 44 which only covers an area within the G coil 42. FIG. 27 shows a case of using the partition structure 45 which is extended to cover a cross sectional area of a room temperature bore of the superconducting magnet 41, and FIG. 28 shows a case of using the partition structure 46 which is further extended to outside of the superconducting magnet 41. In particular, in a case of FIG. 28, it is possible to utilize the partition structure 46 as a wall separating rooms, so that this nuclear magnetic resonance imaging apparatus appear as two separate systems located in two rooms.

Figure 29:
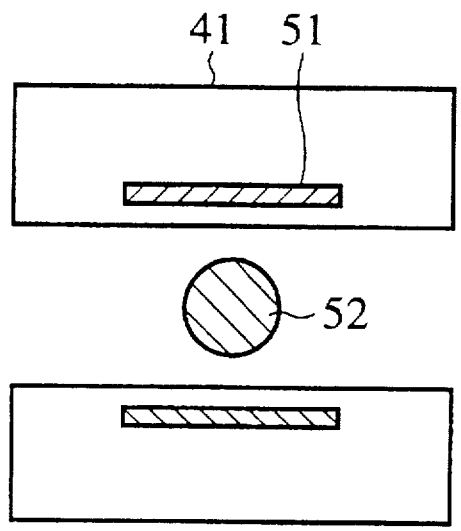
FIG. 29 is a schematic cross sectional view of a conventional superconducting magnet configuration.
Figure 30:
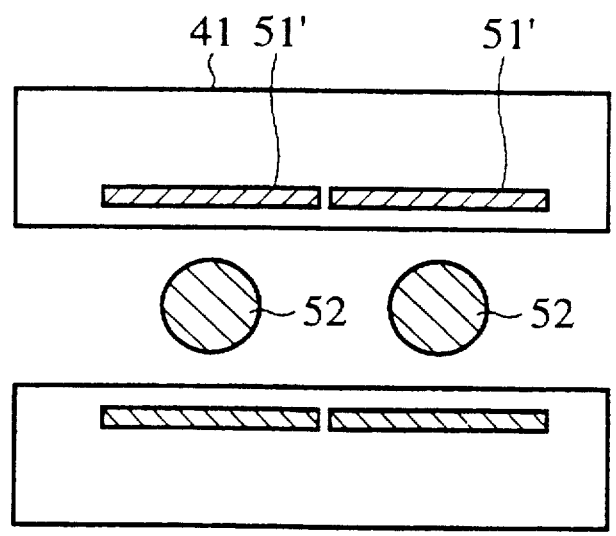
FIG. 30 is a schematic cross sectional view of a superconducting magnet configuration for the ninth embodiment of the present invention.

In such a nuclear magnetic resonance imaging apparatus, the superconducting magnet 41 conventionally has a schematic inner structure as shown in FIG. 29 in which a single set of superconducting wire member 51 is provided to form an imaging region (i.e., a homogeneous static magnetic field region) 52 within a bore of the superconducting magnet 41. In contrast, the superconducting magnet 41 in the nuclear magnetic resonance imaging apparatus of this ninth embodiment (such as a specialized MRI for medical brain checkup with doubled throughput) has a schematic inner structure as shown in FIG. 30 in which two sets of superconducting wire members 51' are provided one next to another, to form two homogeneous static magnetic field regions corresponding to the imaging regions 52 of the G coil 42. Here, unlike the superconducting wire member 51 of FIG. 29, the superconducting wire member 51' of FIG. 30 should be designed by accounting for an influence (contribution) of a static magnetic field formed by one superconducting wire member 51' on another static magnetic field formed by the other superconducting wire member 51'.

Figure 31:
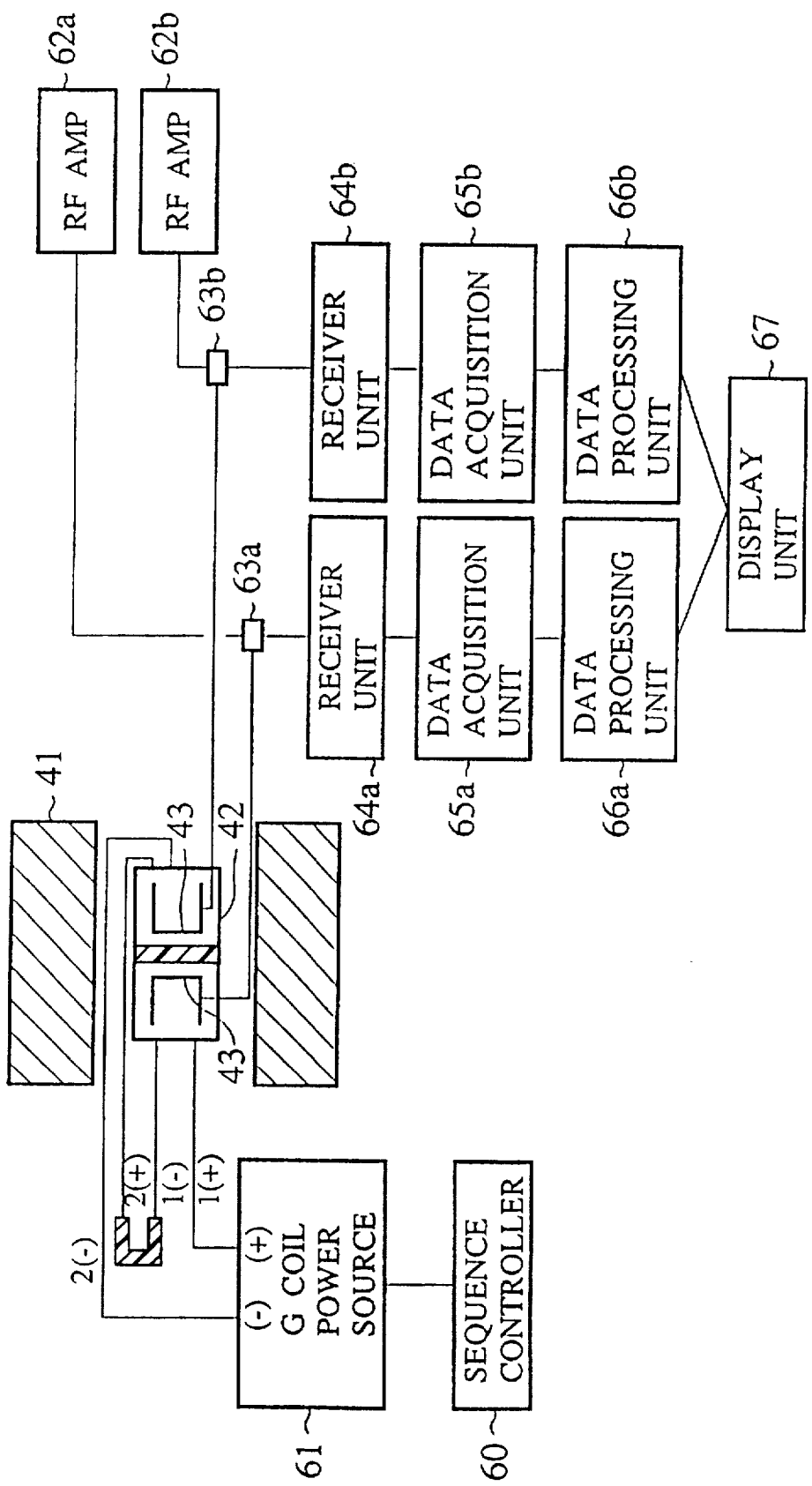
FIG. 31 is a schematic block diagram of one possible system configuration for a nuclear magnetic resonance imaging apparatus in the ninth embodiment of the present invention.

FIG. 31 shows one possible system configuration of the nuclear magnetic resonance imaging apparatus using the G coil 42 of FIG. 24 (such as a specialized MRI for medical brain checkup with doubled throughput). In the G coil 42 of FIG. 24, two asymmetric ASGCs 2a-1 and 2a-2 are usually connected in series and commonly driven by a single gradient coil power source 61. In this case, a sequence controller supplies the desired pulse sequence to the gradient coil power source 60. In the configuration of FIG. 31, two RF coils 43 are connected with two sets of receiver units 64a and 64b, two sets of data acquisition units 65a and 65b, two sets of data processing units 66a and 66b, and a common display unit 67, as well as with RF amps 62a and 62b, through T/R switches 63a and 63b, respectively.

Figure 32:
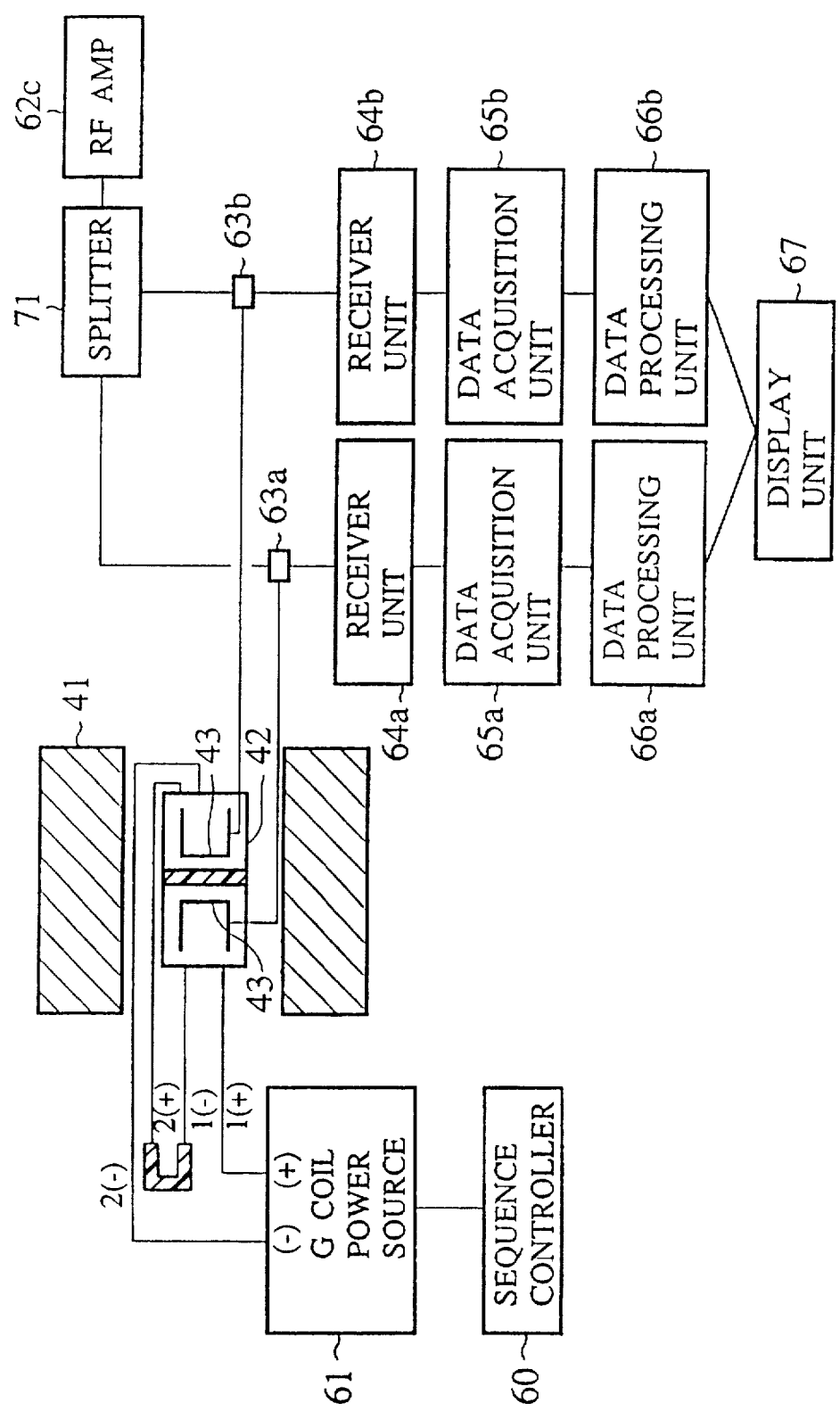
FIG. 32 is a schematic block diagram of another possible system configuration for a nuclear magnetic resonance imaging apparatus in the ninth embodiment of the present invention.

It is also possible to modify this configuration of FIG. 31 as shown in FIG. 32, in which two RF coils 43 share a single RF amp 62c by means of a splitter 71 provided between the RF amp 62c and the T/R switches 63a and 63b.

Figure 33:
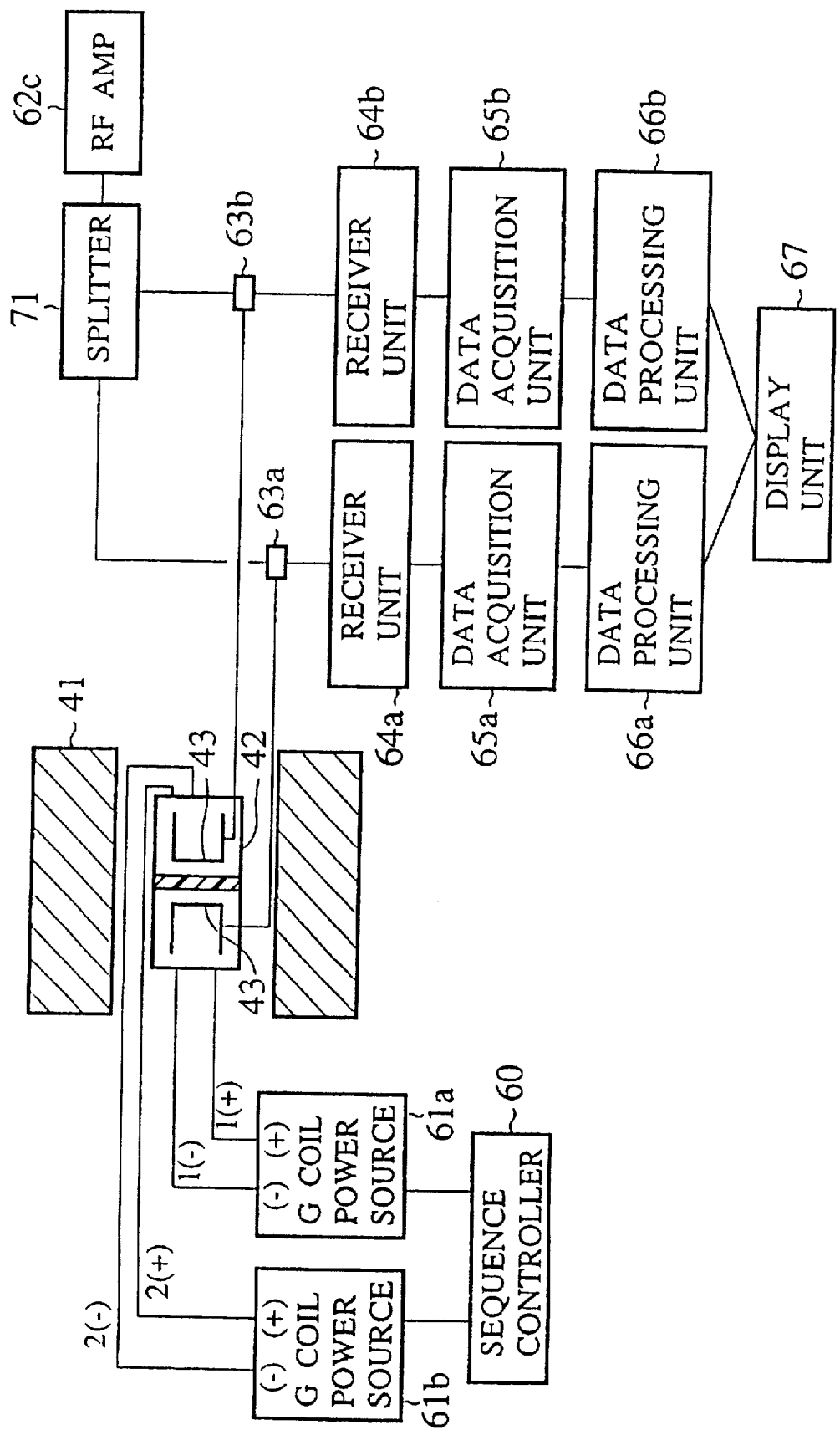
FIG. 33 is a schematic block diagram of another possible system configuration for a nuclear magnetic resonance imaging apparatus in the ninth embodiment of the present invention.

It is also possible to further modify this configuration of FIG. 32 as shown in FIG. 33, in which two sets of gradient coil power sources 61a and 61b are provided in correspondence to two asymmetric ASGCs of the G coil 42. In this case, the sequence controller 60 supplies two (possibly different) pulse sequences to the gradient coil power sources 61a and 61b independently. In this configuration of FIG. 33, there is a possibility for generating a torque during simultaneous execution of two possibly different types of pulse sequences. However, in this nuclear magnetic resonance imaging apparatus using the G coil 42 which is specialized for head portion imaging, the G coil 42 can be fixed to an inner wall of the bore of the superconducting magnet 41, so that the influence of the vibrations, etc. caused by this torque will be insignificant.

Thus, according to this ninth embodiment, it is possible to reduce cost and time required for imaging considerably while protecting the privacy of each patient. In addition, when the same imaging to be made with respect to two patients, it is possible to improve the throughput of the apparatus even further.

Next, the tenth embodiment of a nuclear magnetic resonance imaging apparatus using asymmetric torque-free active shield gradient coil according to the present invention will be described in detail. Here, the elements substantially equivalent to those of the embodiments described above will given the same reference numerals in the figure.

In a case of the G coil of FIG. 9 or FIG. 12 which uses the non-shielding type torque cancellation coil, the leakage magnetic field from this non-shielding type torque cancellation coil is going to be present around this non-shielding type torque cancellation coil. In such a case, as shown in FIG. 35, it is possible to provide current shims 83 in a plurality of channels for producing a specific magnetic field distribution between the G coil and the main magnet and supply currents constantly to these shims 83, in order to improve the homogeneity of the static magnetic field produced by the main magnet as in a usual nuclear magnetic resonance imaging apparatus.

Figure 35:
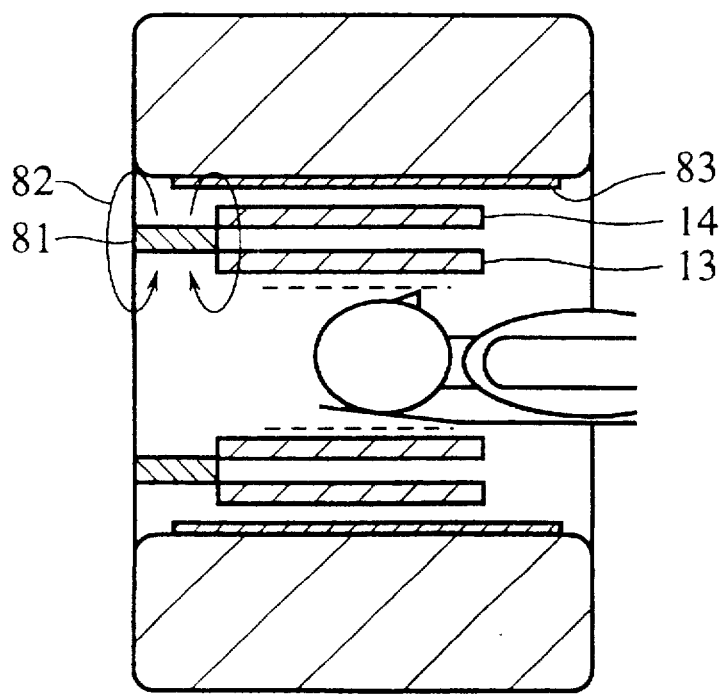
FIG. 35 is a schematic cross sectional view of a comparative shim coil arrangement for an imaging section of a nuclear magnetic resonance imaging apparatus of the tenth embodiment of the present invention.

However, when the shims 83 are provided symmetrically with respect to the G coil as shown in FIG. 35, because of the presence of the leakage magnetic field 82, at a time of driving the G coil, there will be a coupling between the current shims 83 and the torque cancellation coil 81, which varies the currents in the current shims 83 and thereby disturbs the homogeneity of the static magnetic field.

Figure 34:
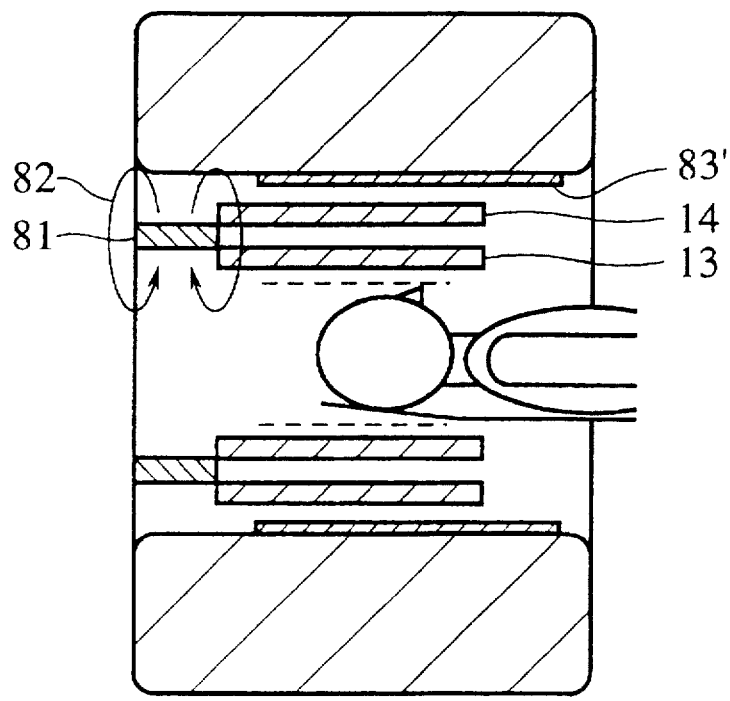
FIG. 34 is a schematic cross sectional view of a preferable shim coil arrangement for an imaging section of a nuclear magnetic resonance imaging apparatus of the tenth embodiment of the present invention.

In this tenth embodiment, this problem is resolved by using a configuration as shown in FIG. 34.

Namely, in this configuration of FIG. 34, a head portion of the patient is inserted into the asymmetric ASGC formed by the primary coil 13 and the shield coil 14, and asymmetric current shims 83' are provided between this asymmetric ASGC and the main magnet. Here, the asymmetric current shims 83' are formed by arranging the current returns, that would have normally been located on a side (close to the head of the patient) near the torque cancellation coil 81 around which the leakage magnetic field 82 is present, on the opposite side (close to the shoulders of the patient), so as to prevent the coupling between the current shims 83' and the torque cancellation coil 81.

In other words, each shim coil has an asymmetric current distribution in which at least one current return is arranged asymmetrically along an axial direction of the shim coil. Here, each shim coil has the asymmetric current distribution in which at least two current returns are collectively arranged in a vicinity of one side (close to the shoulders of the patient) of the shim coil along the axial direction, i.e., each shim coil has the asymmetric current distribution in which all current returns are arranged asymmetrically away from the torque cancellation coil along the axial direction.

More specifically, various components in these asymmetric current shims 83' have asymmetric coil patterns as shown in FIGS. 36A to 36F, in contrast to the axially symmetric coil patterns of corresponding components in conventional current shims 83 as shown in FIGS. 37A to 37F. Here, the Z axis is defined to be a direction of a body axis of the patient pointing from a top of the head toward the shoulders.

Figure 36A:
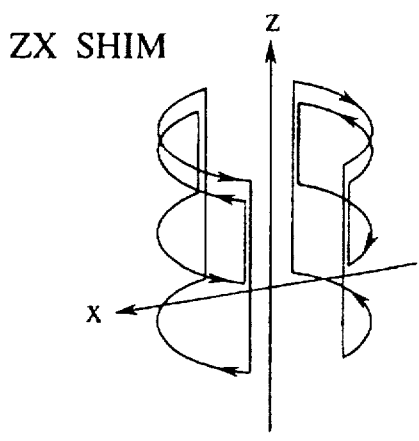
FIGS. 36A to 36F are perspective views of coil patterns for various shim coils for a nuclear magnetic resonance imaging apparatus of the tenth embodiment of the present invention.
Figure 36B:
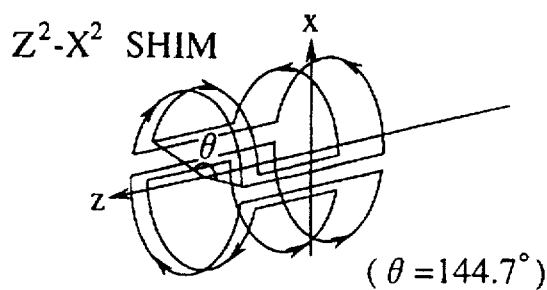
Figure 36C:
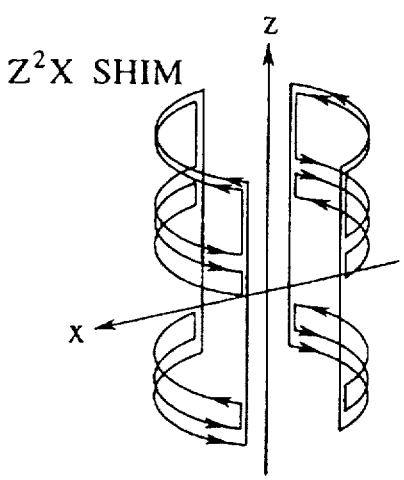
Figure 36D:
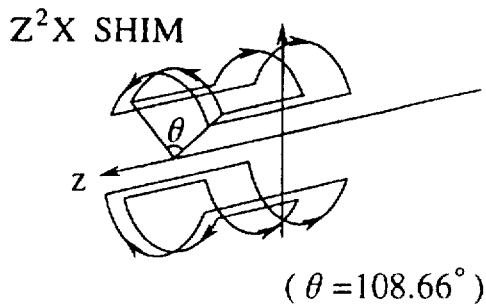
Figure 36E:
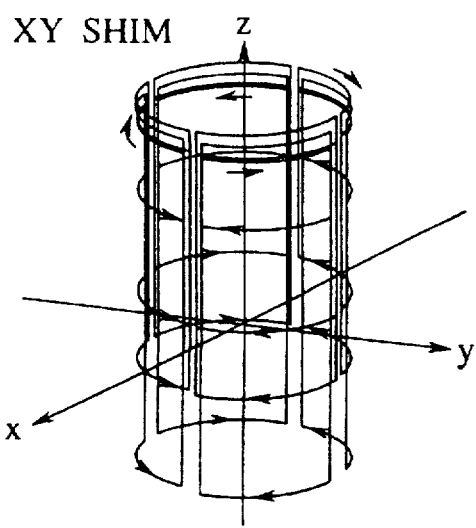
Figure 36F:
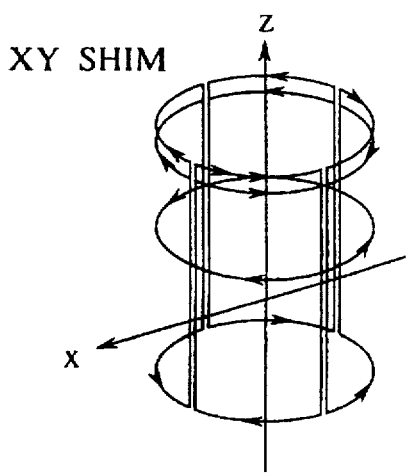
Figure 37A:
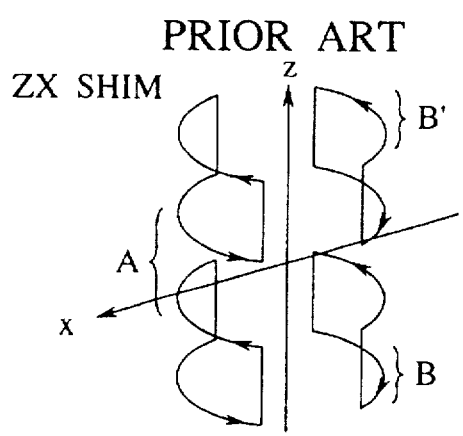
FIGS. 37A to 37F are perspective views of coil patterns for various conventional shim coils for a nuclear magnetic resonance imaging apparatus.
Figure 37B:
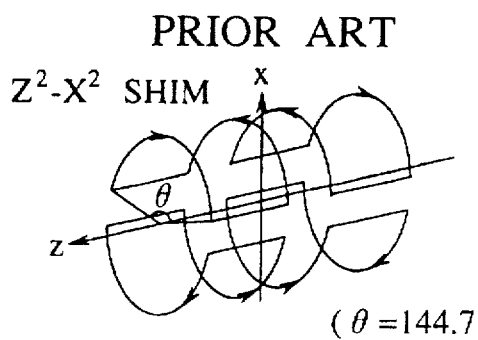
Figure 37C:
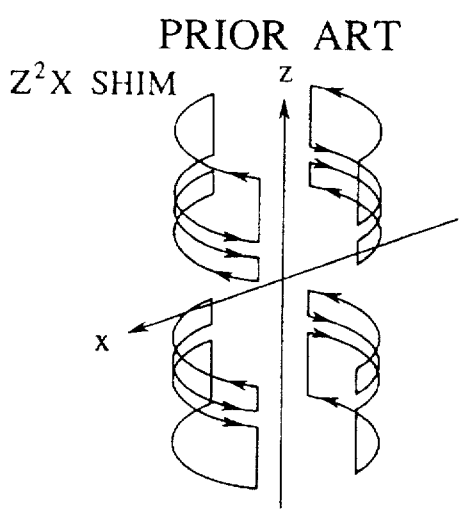
Figure 37D:
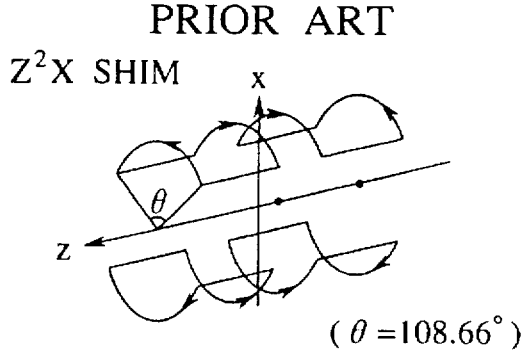
Figure 37E:
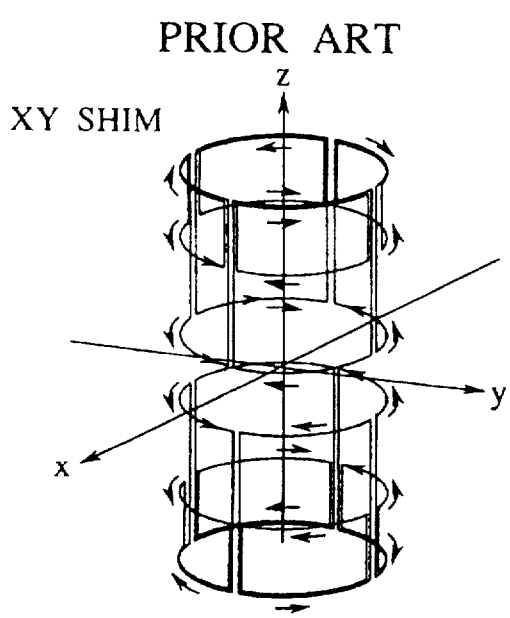
Figure 37F:
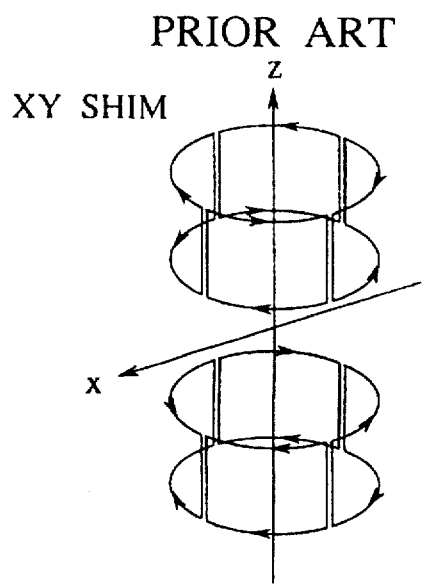

FIG. 36A shows an asymmetric ZX shim, FIG. 36B shows an asymmetric $Z^2-X^2$ shim, FIGS. 36C and 36D show asymmetric $Z^2X$ shims, and FIGS. 36E and 36F show asymmetric XY shims, in contrast to a symmetric ZX shim of FIG. 37A, a symmetric $Z^2-X^2$ shim of FIG. 37B, symmetric $Z^2X$ shims of FIGS. 37C and 37D, and symmetric XY shims of FIGS. 37E and 37F.

For example, in the symmetric ZX shim of FIG. 37A, a current distribution at a middle portion A generates most of the magnetic field distribution in proportion to ZX, and current distributions at end portions B and B' are simply returning currents to the portion A. In the asymmetric ZX him of FIG. 36A, the portion B of FIG. 37A near the head side (−Z side) is flipped over to the shoulder side (+Z side) so as to pass near the B' portion of FIG. 37A. The other symmetric shims of FIGS. 36B to 36F are similarly obtained from the symmetric shims of FIGS. 37B to 37F by flipping the current returns near the head side (−Z side) over to the shoulder side (+Z side).

With these asymmetric shims of FIGS. 36A to 36F, it is possible to reduce the coupling between the shim coils and the leakage magnetic field around the torque cancellation coil of the G coil because the current returns that potentially couple with the leakage magnetic field are displaced to the opposite side.

Figure 2:
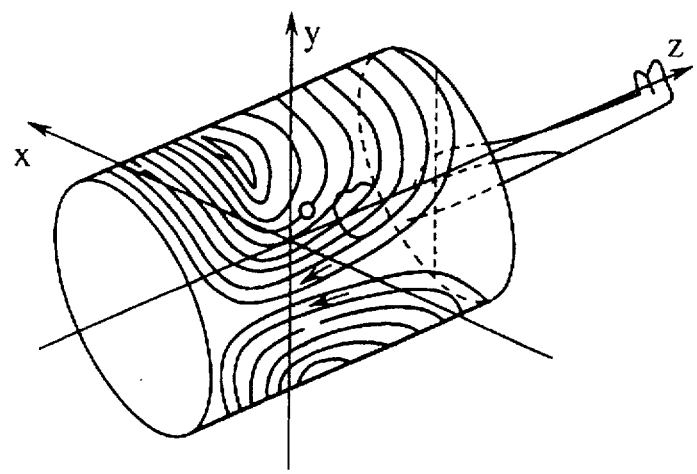
FIG. 2 is a perspective view showing coil patterns for a conventional asymmetric gradient coil.
Figure 3:
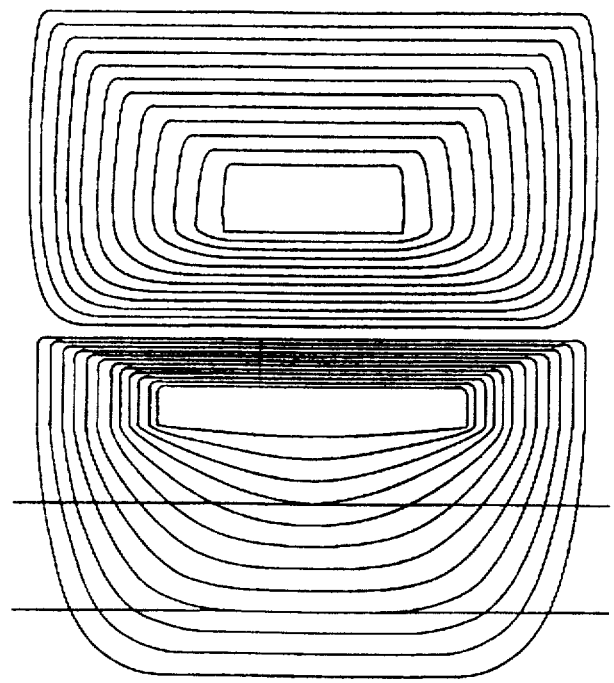
FIG. 3 is a diagram showing coil patterns for a conventional torque-free gradient coil.

Note that the use of these asymmetric shims of this tenth embodiment is effective for any G coil using a non-shielding type torque cancellation coil, not just the G coils of FIG. 9 and FIG. 12 but also a conventional torque-free G coil of FIG. 3, for example. Moreover, the use of these asymmetric shims of this tenth embodiment is also effective in the G coil as disclosed in Japanese Patent Application No. 6-222270 (1994) (corresponding to U.S. patent application Ser. No. 08/528,569 and German Patent Application No. 195 34 587.5) by the present inventors. Namely, in this earlier proposed G coil, the leakage magnetic field shielding property at a portion near the head side of the patient, so that the asymmetric shims of this tenth embodiment can be effectively utilized to reduce the coupling between the shim coils and the leakage magnetic field.

Next, the eleventh embodiment of a nuclear magnetic resonance imaging apparatus using asymmetric torque-free active shield gradient coil according to the present invention will be described in detail.

The nuclear magnetic resonance imaging apparatus using the asymmetric torque-free active shield gradient coil as described above can be used as an MRI specialized for head portion imaging. In this case, the G coil can be formed to have as small a radius as necessary to come sufficiently close to the head portion of the patient. In addition, as the imaging target is limited to the head portion, it suffices for the homogeneous static magnetic field region to cover only about a half of that required in the usual MRI for whole body imaging. For these reasons, it is possible to make an axial length of the main magnet smaller in this case. This eleventh embodiment is directed to such an MRI specialized for head portion imaging.

Figure 39:
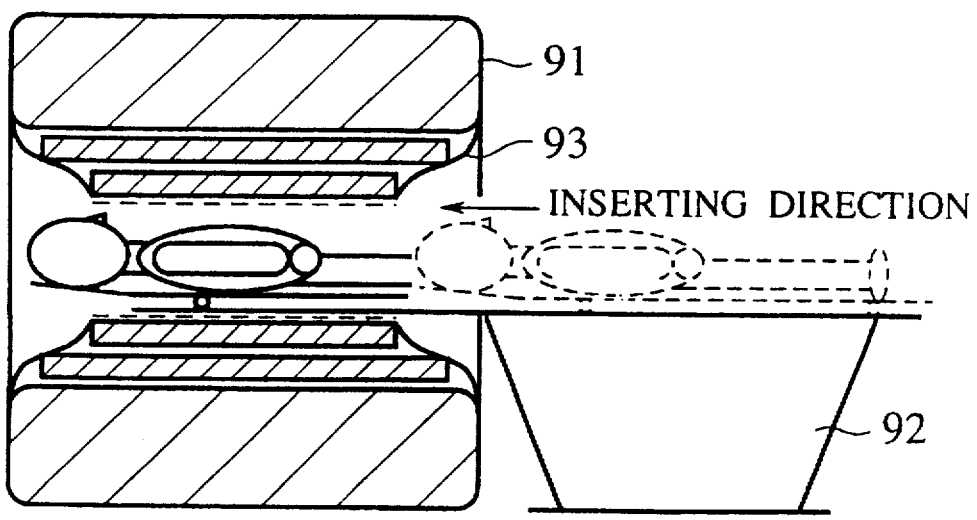
FIG. 39 is a schematic cross sectional view of an imaging section configuration for a conventional nuclear magnetic resonance imaging apparatus.

In the usual MRI for whole body imaging, as shown in FIG. 39, a main magnet 91 itself has a long axial length, and there is a need to insert a belly portion or a leg portion of the patient to a middle of the main magnet 91, so that a bed 92 inevitably makes contact with a patient bore 93 inside the main magnet 91. As a consequence, at a time of the ultra high speed imaging, the vibration of the G coil is propagated to the patient through the patient bore 93, and this in turn causes the degradation of the image quality.

Figure 38:
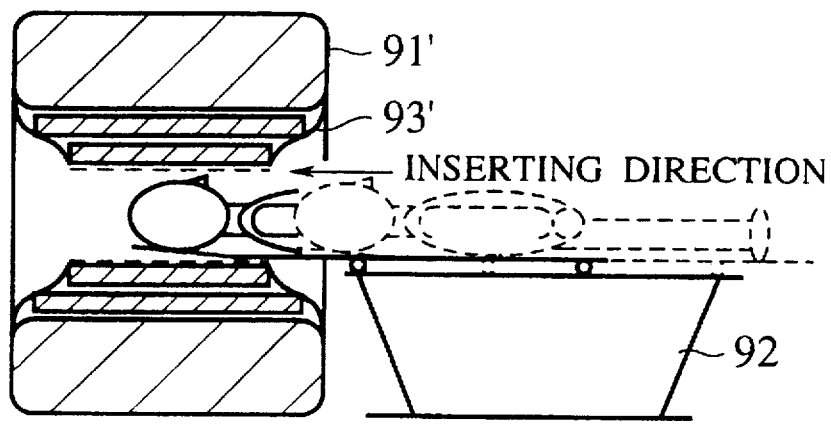
FIG. 38 is a schematic cross sectional view of an imaging section configuration for a nuclear magnetic resonance imaging apparatus in the eleventh embodiment of the present invention.

In contrast, in the nuclear magnetic resonance imaging apparatus of this eleventh embodiment, as shown in FIG. 38, a main magnet 91' has a short axial length, and there is only a need to insert the head portion of the patient to the imaging region inside a patient bore 93', so that it is sufficient to insert a projected head rest portion of the bed 92 into the patient bore 93' and therefore it is possible to prevent a contact between the bed 92 and the patient bore 93'.

Consequently, according to this eleventh embodiment, it is possible to prevent the vibration of the G coil at a time of driving the G coil from propagating directly to the patient, and therefore it is possible to eliminate a source of the image quality degradation as well as a cause of uncomfortable or fearful feelings on patient's mind.

As described, according to the present invention, it is possible to realize a nuclear magnetic resonance imaging apparatus using gradient coils capable of realizing a sufficient imaging field of view for a head portion imaging comparable to the conventional asymmetric G coil, a sufficient eddy current magnetic field suppression effect comparable to the conventional ASGC, and a substantially complete torque cancellation.

In particular, the asymmetric torque-free active shield gradient coil of the present invention is expected to be capable of realizing more than ten times smaller noise, more than several times smaller dB/dt, and more than ten times smaller heat generation for enabling a realization of a considerably improved real time performance. On a basis of this considerably improved gradient coil property, there will a great potential for a wide use of various next generation imaging schemes such as high precision MRA, brain function imaging, Diffusion & Perfusion imaging, etc. in a routine clinical diagnosis for head portion. In addition, it may also be possible to develop some totally new pulse sequences for head portion imaging which are not realizable even by means of a conventional G coil system using accelerators for whole body imaging and a conventional silent head portion imaging scheme.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A gradient coil for a nuclear magnetic resonance imaging, comprising:
    an asymmetric active shield gradient coil formed by: a primary coil having an asymmetric current distribution in which all current returns are asymmetrically arranged toward one side of the primary coil, for generating a gradient magnetic field; and a shield coil having a current distribution for cancelling out a leakage magnetic field generated by the asymmetric current distribution of the primary coil; and
    a torque cancellation coil, provided adjacent to the primary coil and the shield coil, having a current distribution for cancelling out a torque acting on the primary coil and the shield coil in a static magnetic field;
    wherein the primary coil generates the gradient magnetic field which cancels out a gradient field contribution from the torque cancellation coil to produce a desired gradient magnetic field.

2. The gradient coil of claim 1, wherein the torque cancellation coil is a complete shielding type coil formed by a torque cancellation primary coil and a torque cancellation shield coil.

3. The gradient coil of claim 2, wherein the torque cancellation primary coil is a saddle type coil having a saddle shaped current distribution, and the torque cancellation shield coil is a fingerprint type coil having a fingerprint shaped current distribution.

4. The gradient coil of claim 2, wherein the torque cancellation coil functions as another active shield gradient coil for generating another gradient magnetic field.

5. The gradient coil of claim 4, wherein the torque cancellation primary coil has an asymmetric current distribution in which all current returns are asymmetrically arranged toward one side of the torque cancellation primary coil, for generating said another gradient magnetic field, and the torque cancellation shield coil has a current distribution for cancelling out a leakage magnetic field generated by the asymmetric current distribution of the torque cancellation primary coil.

6. The gradient coil of claim 1, wherein the torque cancellation coil is a non-shielding type coil.

7. The gradient coil of claim 6, wherein the torque cancellation coil is a non-shielding saddle type coil having a saddle shaped current distribution.

8. The gradient coil of claim 1, wherein the asymmetric active shield gradient coil has coil patterns formed by etching manufactured conductors, and the torque cancellation coil has coil patterns formed by constant width conductors.

9. The gradient coil of claim 1, further comprising:
hollow structural members provided at structurally open spaces within at least one of the asymmetric active shield gradient coil and the torque cancellation coil.

10. The gradient coil of claim 1, further comprising:
coil cooling members provided at structurally open spaces within at least one of the asymmetric active shield gradient coil and the torque cancellation coil.

11. A nuclear magnetic resonance imaging apparatus, comprising:
gradient coil means including:
an asymmetric active shield gradient coil formed by: a primary coil having an asymmetric current distribution in which all current returns are asymmetrically arranged toward one side of the primary coil, for generating a gradient magnetic field; and a shield coil having a current distribution for cancelling out a leakage magnetic field generated by the asymmetric current distribution of the primary coil; and
a torque cancellation coil, provided adjacent to the primary coil and the shield coil, having a current distribution for cancelling out a torque acting on the primary coil and the shield coil in a static magnetic field;
wherein the primary coil generates the gradient magnetic field which cancels out a gradient field contribution from the torque cancellation coil to produce a desired gradient magnetic field; and
imaging means for imaging a body to be examined placed in a static magnetic field by applying a radio frequency magnetic field onto the body to be examined and operating the gradient coil means to apply the desired gradient magnetic field onto the body to be examined according to a pulse sequence, detecting nuclear magnetic resonance signals emitted from the body to be examined in response to the radio frequency magnetic field and the gradient magnetic field, and processing the nuclear magnetic resonance signals to construct nuclear magnetic resonance images.

12. The apparatus of claim 11, wherein the torque cancellation coil is a complete shielding type coil formed by a torque cancellation primary coil and a torque cancellation shield coil.

13. The apparatus of claim 12, wherein the torque cancellation primary coil is a saddle type coil having a saddle shaped current distribution, and the torque cancellation shield coil is a fingerprint type coil having a fingerprint shaped current distribution.

14. The apparatus of claim 12, wherein the torque cancellation coil functions as another active shield gradient coil for generating another gradient magnetic field.

15. The apparatus of claim 14, wherein the torque cancellation primary coil has an asymmetric current distribution in which all current returns are asymmetrically arranged toward one side of the torque cancellation primary coil, for generating said another gradient magnetic field, and the torque cancellation shield coil has a current distribution for cancelling out a leakage magnetic field generated by the asymmetric current distribution of the torque cancellation primary coil.

16. The apparatus of claim 11, wherein the torque cancellation coil is a non-shielding type coil.

17. The apparatus of claim 16, wherein the torque cancellation coil is a non-shielding saddle type coil having a saddle shaped current distribution.

18. The apparatus of claim 11, wherein the asymmetric active shield gradient coil has coil patterns formed by etching manufactured conductors, and the torque cancellation coil has coil patterns formed by constant width conductors.

19. The apparatus of claim 11, further comprising:
hollow structural members provided at structurally open spaces within at least one of the asymmetric active shield gradient coil and the torque cancellation coil.

20. The apparatus of claim 11, further comprising:
coil cooling members provided at structurally open spaces within at least one of the asymmetric active shield gradient coil and the torque cancellation coil.

21. The apparatus of claim 11, further comprising:
a shim coil having an asymmetric current distribution in which at least one current return is arranged asymmetrically along an axial direction of the shim coil, for adjusting a homogeneity of the static magnetic field.

22. The apparatus of claim 21, wherein the shim coil has the asymmetric current distribution in which at least two current returns are collectively arranged in a vicinity of one side of the shim coil along the axial direction.

23. The apparatus of claim 21, wherein the torque cancellation coil is a non-shielding type coil, and the shim coil has the asymmetric current distribution in which all current returns are arranged asymmetrically away from the torque cancellation coil along the axial direction.

24. The apparatus of claim 21, wherein the imaging means includes a bore portion for placing the body to be examined within the static magnetic field, and the apparatus further comprises bed means for placing an imaging target portion of the body to be examined in an imaging region of the gradient coil means formed inside the bore portion, the bed means having a projecting part for supporting the imaging target portion in the imaging region without making a contact with the bore portion.

25. A gradient coil for a nuclear magnetic resonance imaging apparatus, comprising:
first gradient coil means including: a first primary coil having an asymmetric current distribution in which all current returns are asymmetrically arranged toward one side of the first primary coil, for generating a first gradient magnetic field; and a first shield coil having a current distribution for cancelling out a leakage magnetic field generated by the asymmetric current distribution of the first primary coil; and
second gradient coil means including: a second primary coil having an asymmetric current distribution in which all current returns are asymmetrically arranged toward one side of the second primary coil, for generating a second gradient magnetic field; and a second shield coil having a current distribution for cancelling out a leakage magnetic field generated by the asymmetric current distribution of the second primary coil;

wherein the first and second gradient coil means are arranged adjacent to each other symmetrically with respect to a border between the first and second gradient coil means, each one of the first and second gradient coil means functions as a torque cancellation coil for cancelling out a torque acting on another one of the first and second gradient coil means in a static magnetic field.

26. The gradient coil of claim 25, wherein the first primary coil generates the first gradient magnetic field which cancels out a leakage gradient field contribution from the second primary coil to produce a first desired gradient magnetic field, and the second primary coil generates the second gradient magnetic field which cancels out a leakage gradient field contribution from the first primary coil to produce a second desired gradient magnetic field.

27. The gradient coil of claim 25, wherein the first and second gradient coil means are connected in series so that the first and second gradient coil means can be driven by a common power source.

28. A nuclear magnetic resonance imaging apparatus, comprising:

first gradient coil means including: a first primary coil having an asymmetric current distribution in which all current returns are asymmetrically arranged toward one side of the first primary coil, for generating a first gradient magnetic field; and a first shield coil having a current distribution for cancelling out a leakage magnetic field generated by the asymmetric current distribution of the first primary coil;

second gradient coil means including: a second primary coil having an asymmetric current distribution in which all current returns are asymmetrically arranged toward one side of the second primary coil, for generating a second gradient magnetic field; and a second shield coil having a current distribution for cancelling out a leakage magnetic field generated by the asymmetric current distribution of the second primary coil;

wherein the first and second gradient coil means are arranged adjacent to each other symmetrically with respect to a border between the first and second gradient coil means, each one of the first and second gradient coil means functions as a torque cancellation coil for cancelling out a torque acting on another one of the first and second gradient coil means in a static magnetic field; and imaging means for imaging two bodies to be examined placed in a static magnetic field by applying radio frequency magnetic fields onto said two bodies to be examined and operating the first and second gradient coil means to apply the first and second gradient magnetic fields onto said two bodies to be examined, respectively, according to pulse sequences, detecting nuclear magnetic resonance signals emitted from said two bodies to be examined in response to the radio frequency magnetic fields and the first and second gradient magnetic fields, and processing the nuclear magnetic resonance signals to construct nuclear magnetic resonance images.

29. The apparatus of claim 28, wherein the first primary coil generates the first gradient magnetic field which cancels out a leakage gradient field contribution from the second primary coil to produce a first desired gradient magnetic field, and the second primary coil generates the second gradient magnetic field which cancels out a leakage gradient field contribution from the first primary coil to produce a second desired gradient magnetic field.

30. The apparatus of claim 28, wherein the first and second gradient coil means are connected in series, and the apparatus further comprises a gradient coil power source for driving the first and second gradient coil means commonly.

31. The apparatus of claim 28, wherein the imaging means includes two imaging systems provided in correspondence to the first and second gradient coil means.

32. The apparatus of claim 28, wherein the imaging means includes:

a first radio frequency coil for applying a first radio frequency magnetic field in superposition to the first gradient magnetic field onto one body to be examined;

a second radio frequency coil for applying a second radio frequency magnetic field in superposition to the second gradient magnetic field onto another body to be examine;

a radio frequency signal source for generating radio frequency signals; and a splitter for splitting the radio frequency signals generated by the radio frequency signal source and distributing the radio frequency signals to the first and second radio frequency coils.

33. The apparatus of claim 28, wherein the imaging means includes:

a superconducting magnet having two sets of superconducting wire members for generating the static magnetic field including two homogeneous static magnetic field regions in correspondence to the first and second gradient coils.

34. A nuclear magnetic resonance imaging apparatus, comprising:

imaging means for imaging a body to be examined placed in a static magnetic field by applying a radio frequency magnetic field and gradient magnetic field onto the body to be examined according to a pulse sequence, detecting nuclear magnetic resonance signals emitted from the body to be examined in response to the radio frequency magnetic field and the gradient magnetic field, and processing the nuclear magnetic resonance signals to construct nuclear magnetic resonance images; and a shim coil having an asymmetric current distribution in which at least one current return is arranged asymmetrically along an axial direction of the shim coil, for adjusting a homogeneity of the static magnetic field.

35. The apparatus of claim 34, wherein the shim coil has the asymmetric current distribution in which at least two current returns are collectively arranged in a vicinity of one side of the shim coil along the axial direction.

36. The apparatus of claim 34, wherein the imaging means include gradient coil means for generating the gradient magnetic field including a non-shielding type torque cancellation coil, and the shim coil has the asymmetric current distribution in which all current returns are arranged asymmetrically away from the torque cancellation coil along the axial direction.

* * * * *